United States Patent
Morimoto et al.

(10) Patent No.: US 12,310,237 B2
(45) Date of Patent: May 20, 2025

(54) OPTICALLY ANISOTROPIC FILM AND LAMINATE INCLUDING THE SAME

(71) Applicant: Sumitomo Chemical Company, Limited, Tokyo (JP)

(72) Inventors: Kensuke Morimoto, Osaka (JP); Nobuyuki Hatanaka, Niihama (JP); Takayuki Nada, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 459 days.

(21) Appl. No.: 17/739,447

(22) Filed: May 9, 2022

(65) Prior Publication Data
US 2022/0384739 A1    Dec. 1, 2022

(30) Foreign Application Priority Data

May 11, 2021  (JP) ................. 2021-080626

(51) Int. Cl.
*H01L 51/00* (2006.01)
*H10K 85/00* (2023.01)
*H10K 85/60* (2023.01)

(52) U.S. Cl.
CPC ......... *H10K 85/731* (2023.02); *H10K 85/652* (2023.02)

(58) Field of Classification Search
CPC ............. H10K 59/8793; H10K 85/731; H10K 85/652; G02B 5/3016; G02B 5/3083; G02F 1/133528
See application file for complete search history.

(56) References Cited

FOREIGN PATENT DOCUMENTS

JP           7537862 B2 *  8/2024

* cited by examiner

*Primary Examiner* — Jay C Kim
(74) *Attorney, Agent, or Firm* — Panitch Schwarze Belisario & Nadel LLP

(57) ABSTRACT

An optically anisotropic film capable of effectively reducing a difference in hue between a front hue and an oblique hue during white display of an organic EL display device and which exhibits excellent image display properties, and a laminate including the optically anisotropic film are provided. The optically anisotropic film is a cured film of a polymerizable liquid crystal composition containing a polymerizable liquid crystal compound and at least two dichroic dyes, in which the polymerizable liquid crystal compound and the at least two dichroic dyes are cured in a state of being molecularly oriented in a vertical direction with respect to a film plane, and satisfy specific relationships between absorbance of linearly polarized light that oscillates in an x-axis direction and absorbance of linearly polarized light that oscillates in the x-axis direction when the optically anisotropic film is rotated by 500 with the y-axis as a rotation axis.

10 Claims, No Drawings

OPTICALLY ANISOTROPIC FILM AND LAMINATE INCLUDING THE SAME

CROSS-REFERENCE TO RELATED APPLICATIONS

This application claims priority under 35 U.S.C. § 119 (b) to Japanese Application No. 2021-080626, filed on May 11, 2021, the disclosure of which is incorporated herein by reference in its entirety.

BACKGROUND OF THE INVENTION

Field of the Invention

The present invention relates to an optically anisotropic film, a laminate including the optically anisotropic film, and an organic EL display device including the laminate.

Description of the Related Art

In a generally widely used organic EL display device, since a hue when viewed from the front and a hue when viewed from an oblique direction during white display are different, there may be a problem in that a hue changes depending on an angle at which an image is viewed. On the other hand, an effect of reducing the viewing angle dependence has been found by applying a laminate including a vertically oriented liquid crystal cured film which is a cured product of a polymerizable liquid crystal composition containing a polymerizable liquid crystal compound and a dichroic dye having a single maximum absorption wavelength, and a horizontally oriented retardation film (for example, JP-A-2010-111823).

SUMMARY OF THE INVENTION

However, there is a strong demand for improvement of an oblique hue during the white display in the organic EL display device, and further improvement of the effect of reducing the viewing angle dependence during the white display, which can improve even slight coloring of the oblique hue, is expected.

Therefore, according to the present invention, there is provided an optically anisotropic film capable of more effectively reducing a hue difference between a front hue and an oblique hue during white display of an organic EL display device and exhibiting excellent image display properties, and a laminate including the optically anisotropic film.

As a result of intensive studies to solve the above problems, the present inventors have completed the present invention. That is, the present invention includes the following aspects.

[1] An optically anisotropic film which is a cured film of a polymerizable liquid crystal composition containing a polymerizable liquid crystal compound and at least two dichroic dyes, in which the optically anisotropic film is a film in which the polymerizable liquid crystal compound and the at least two dichroic dyes are cured in a state of being molecularly oriented in a vertical direction with respect to a film plane, and satisfies Formula (1) to Formula (6) or Formula (4) to Formula (9) below:

$$0.001 \leq Ax450(z=50) \leq 0.100 \quad (1)$$

$$0.070 \leq Ax550(z=50) \leq 1.000 \quad (2)$$

$$0.070 \leq Ax650(z=50) \leq 1.000 \quad (3)$$

$$0.001 \leq Ax450 \leq 0.050 \quad (4)$$

$$0.001 \leq Ax550 \leq 0.050 \quad (5)$$

$$0.001 \leq Ax650 \leq 0.050 \quad (6)$$

$$0.050 \leq Ax450(z=50) \leq 1.000 \quad (7)$$

$$0.070 \leq Ax550(z=50) \leq 1.000 \quad (8)$$

$$0.001 \leq Ax650(z=50) \leq 0.100 \quad (9)$$

[in Formulae (1) to (9), both $Ax\lambda$ and $Ax\lambda(z=50)$ represent absorbance at a wavelength $\lambda$ nm, Ax represents an absorbance of linearly polarized light that oscillates in an x-axis direction, and $Ax(z=50)$ represents an absorbance of linearly polarized light that oscillates in the x-axis direction when the optically anisotropic film is rotated by 500 with a y-axis as a rotation axis, the x-axis represents optional direction in-plane of the optically anisotropic film, the y-axis represents a direction orthogonal to the x-axis in-plane, and the z-axis represents a thickness direction of the optically anisotropic film].

[2] The optically anisotropic film according to [1], in which the at least two dichroic dyes include a combination of at least one cyan dye and at least one magenta dye or a combination of at least one yellow dye and at least one magenta dye.

[3] The optically anisotropic film according to [1] or [2], which satisfies Formula (10) or Formula (11) below:

$$0.1 \leq Ax450(z=50)/Ax550(z=50) \leq 1.5 \quad (10)$$

$$0.1 \leq Ax650(z=50)/Ax550(z=50) \leq 1.5 \quad (11)$$

[in Formulae (10) and (11), $Ax\lambda$ and $Ax\lambda(z=50)$ have a same meaning as described above].

[4] The optically anisotropic film according to any one of [1] to [3], in which a film thickness is 0.1 µm or more and 5 µm or less, and the at least two dichroic dyes are contained in an amount of 0.1 parts by mass or more and 5 parts by mass or less, based on 100 parts by mass of a polymerizable liquid crystal compound.

[5] The optically anisotropic film according to [4], in which the at least two dichroic dyes include a combination of at least one cyan dye and at least one magenta dye or a combination of at least one yellow dye and at least one magenta dye, and satisfy Formula (12) and Formula (13) below:

$$T \times D1 = 0.4 \text{ to } 1.7 \quad (12)$$

$$T \times D2 = 0.6 \text{ to } 2.7 \quad (13)$$

[in Formulae (12) and (13), T represents a film thickness (µm), D1 represents an amount (parts by mass) of a cyan dye or a yellow dye based on 100 parts by mass of the polymerizable liquid crystal compound, and D2 represents an amount (parts by mass) of a magenta dye based on 100 parts by mass of the polymerizable liquid crystal compound].

[6] The optically anisotropic film according to any one of [1] to [5], containing at least one azo dye as the dichroic dye.

[7] The optically anisotropic film according to any one of [1] to [6], in which the polymerizable liquid crystal compound is a liquid crystal compound exhibiting a higher order smectic liquid crystal phase.

[8] A laminate including
the optically anisotropic film according to any one of [1] to [7];
a polarizing film; and
a horizontally oriented retardation film.
[9] The laminate according to [8], including in order of:
the optically anisotropic film;
the polarizing film; and
the horizontally oriented retardation film.
[10] The laminate according to [9], further including:
a vertically oriented retardation film on a side of the horizontally oriented retardation film opposite to the polarizing film.
[11] An organic EL display device including the laminate according to any one of [8] to [10].

According to the present invention, it is possible to provide an optically anisotropic film capable of more effectively reducing a hue difference between a front hue and an oblique hue during white display of an organic EL display device and exhibiting excellent image display properties, and a laminate including the optically anisotropic film.

DETAILED DESCRIPTION OF THE PREFERRED EMBODIMENTS

<Optically Anisotropic Film>

The optically anisotropic film of the present invention is a cured film of a polymerizable liquid crystal composition (hereinafter, also referred to as "composition for forming an optically anisotropic film") containing a polymerizable liquid crystal compound and at least two dichroic dyes. The cured film is a film in which the polymerizable liquid crystal compound and the at least two dichroic dyes are cured in a state of being molecularly oriented in a vertical direction with respect to a film plane of the liquid crystal cured film, and satisfies the following Formulae (1) to (6) or Formulae (4) to (9).

$$0.001 \leq Ax450(z=50) \leq 0.100 \quad (1)$$

$$0.070 \leq Ax550(z=50) \leq 1.000 \quad (2)$$

$$0.070 \leq Ax650(z=50) \leq 1.000 \quad (3)$$

$$0.001 \leq Ax450 \leq 0.050 \quad (4)$$

$$0.001 \leq Ax550 \leq 0.050 \quad (5)$$

$$0.001 \leq Ax650 \leq 0.050 \quad (6)$$

$$0.050 \leq Ax450(z=50) \leq 1.000 \quad (7)$$

$$0.070 \leq Ax550(z=50) \leq 1.000 \quad (8)$$

$$0.001 \leq Ax650(z=50) \leq 0.100 \quad (9)$$

In Formulae (1) to (9), both $Ax\lambda$ and $Ax\lambda(z=50)$ represent absorbance at a wavelength $\lambda$ nm. $Ax$ represents an absorbance of linearly polarized light that oscillates in an x-axis direction, and $Ax(z=50)$ represents an absorbance of linearly polarized light that oscillates in the x-axis direction when the optically anisotropic film is rotated by 50° with a y-axis as a rotation axis. Here, the x-axis represents optional direction in-plane of the optically anisotropic film, the y-axis represents a direction orthogonal to the x-axis in-plane, and the z-axis represents a thickness direction of the optically anisotropic film.

The absorbance in the present specification indicates the absorbance measured in a state in which the influence of interface reflection at the time of measurement is eliminated. Examples of the method for removing the influence of the interface reflection include a method for setting the absorbance at a wavelength, at which the absorption of the compound can be ignored at a long wavelength such as a wavelength of 800 nm, to 0 using a spectrophotometer and measuring the absorbance at a wavelength $\lambda$ in a region where the absorption of the compound exists in that state.

The $Ax\lambda(z=50)$ can be measured by entering the same linearly polarized light as that of the linearly polarized light for which $Ax$ is measured in a state where the optically anisotropic film is rotated by 50° with the y axis as the rotation axis. Here, the rotation of the film is performed by rotating the film in the state where $Ax$ is measured by 50° in the incident direction of the linearly polarized light with the y axis as the rotation axis. It can be said that the smaller the value of $Ax\lambda(z=50)$, the smaller the absorption with respect to light having a wavelength near $\lambda$ nm in the oblique direction of the optically anisotropic film, and the larger the value of $Ax\lambda(z=50)$, the larger the absorption with respect to light having a wavelength near $\lambda$ nm in the oblique direction of the optically anisotropic film. By controlling the value of $Ax\lambda(z=50)$ at 450 nm, 550 nm, and 650 nm, light of a specific wavelength can be selectively absorbed in the oblique direction of the optically anisotropic film, and the oblique hue during white display when incorporated in the organic EL display device can be improved.

Hereinafter, the effect related to the improvement (change) of the "oblique hue" in the present specification means an improvement effect (that is, the effect of reducing coloring when viewed from an oblique direction during the white display) in the oblique hue during the white display when the optically anisotropic film is applied to a display device in combination with a horizontally oriented retardation film. When the effect of improving the oblique hue during the white display is high, the hue difference between the front hue and the oblique hue during the white display tends to be small, which is preferable.

The $Ax\lambda$ can be measured by entering linearly polarized light oscillating in the x-axis direction from the z-axis direction toward the film surface of the optically anisotropic film. It can be said that the smaller the value of $Ax\lambda$ is, the smaller the absorption of light near the wavelength A nm in the front direction of the optically anisotropic film is, which means that the transmittance to light from the front direction is excellent, and the front hue during the white display when incorporated into the organic EL display device is excellent.

Hereinafter, the effect related to the improvement (change) of the "front hue" in the present specification means an improvement effect (that is, the effect of reducing coloring when viewed from a front direction during the white display) in the front hue during the white display when the optically anisotropic film is applied to a display device in combination with a horizontally oriented retardation film. In addition, the absorbance of the linearly polarized light oscillating in the y-axis direction from the z-axis direction toward the film surface of the optically anisotropic film is represented as $Ay\lambda$, but in the optically anisotropic film of the present invention, $Ax\lambda$ and $Ay\lambda$ usually have substantially the same value. When $Ax\lambda$ and $Ay\lambda$ are different from each other, the optically anisotropic film has dichroism in the plane, and in this case, the coloring of the optically anisotropic film to the front hue tends to increase.

When Formulae (1) to (6) or Formulae (4) to (9) are satisfied, an optically anisotropic film that can effectively transmit light in the front direction of the optically anisotropic film and can selectively absorb light having a specific wavelength in the oblique direction is obtained. The optically anisotropic film having such optical characteristics can be said to have excellent polarizing performance (light absorption anisotropy performance), and can reduce the hue difference between the front hue and the oblique hue during the white display when incorporated in the organic EL display device.

In one aspect of the present invention, the optically anisotropic film of the present invention satisfies the above Formulae (1) to (6) (hereinafter, the optically anisotropic film satisfying Formulae (1) to (6) is also referred to as "optically anisotropic film (a)"). Since the optically anisotropic film (a) satisfies the above Formulae (1) to (3), the optically anisotropic film (a) hardly absorbs light having a wavelength near 450 nm in the oblique direction, and absorbs the light having a wavelength near 550 nm and light having a wavelength near 650 nm. In addition, by satisfying Formulae (4) to (6), there is almost no absorption for the light having a wavelength of 450 nm to 650 nm in the front direction.

In another aspect of the present invention, the optically anisotropic film of the present invention satisfies the above Formulae (4) to (9) (hereinafter, the optically anisotropic film satisfying Formulae (4) to (9) is also referred to as "optically anisotropic film (b)").

Since the optically anisotropic film (b) satisfies the above Formulae (7) to (9), the optically anisotropic film (b) hardly absorbs the light having a wavelength near 650 nm in the oblique direction, and absorbs the light having a wavelength near 450 nm and the light having a wavelength near 550 nm. In addition, by satisfying Formulae (4) to (6), there is almost no absorption for the light having a wavelength of 450 nm to 650 nm in the front direction.

In the optically anisotropic film of the present invention satisfying Formulae (1) to (6) or Formulae (4) to (9), at least two kinds of dichroic dyes exist while being wrapped in a polymerizable liquid crystal compound, and the polymerizable liquid crystal compound and the at least two kinds of dichroic dyes are oriented with a high degree of order in the vertical direction of the liquid crystal cured film. By having such optical characteristics, excellent transmittance to light from the front direction during the white display and high selective absorbability to light of a specific wavelength in an oblique direction are exhibited, so that the hue difference between the front hue and the oblique hue can be further reduced during the white display when incorporated into the organic EL display device. Such an optically anisotropic film of the present invention can cancel the coloring when the display constituting the organic EL display device is visually recognized from the oblique direction, so that it is possible to effectively suppress the oblique hue change during the white display of the organic EL display device. For example, by selecting the optically anisotropic film (a) or the optically anisotropic film (b) having a complementary color relationship with respect to the hue during white display (during white light emission) of the organic EL display at an angle of 45°, the hue of the display when the organic EL display device is viewed from the oblique direction can be canceled, and the change in the oblique hue can be suppressed without affecting the hue in the front direction during the white display.

In the related art, a display for an organic EL display device that is widely used generally looks yellowish and bluish when viewed from an oblique direction. For example, when the optically anisotropic film (a) that hardly absorbs the light having a wavelength near 450 nm and absorbs the light having wavelengths near 550 nm and near 650 nm is used in combination with a display (for example, typically, a display whose oblique hue is yellowish) that has maximum light emission within a wavelength of 550 to 700 nm during the white display at an angle of 45°, it is possible to improve the oblique hue during the white display. In addition, when the optically anisotropic film (b) that hardly absorbs the light having a wavelength near 650 nm and absorbs the light having wavelengths near 450 nm and near 550 nm is used in combination with a display (for example, typically, a display whose oblique hue is bluish) that has maximum light emission within a wavelength of 400 to 550 nm during the white display at an angle of 45°, it is possible to improve the oblique hue during the white display.

In the optically anisotropic film (a), the value of Ax450 (z=50) is 0.001 or more and 0.100 or less, and the values of Ax550(z=50) and Ax650(z=50) are 0.070 or more and 1.000 or less, respectively. In the optically anisotropic film (a), the value of Ax450(z=50) is preferably 0.005 or more and more preferably 0.010 or more, and is preferably 0.080 or less and more preferably 0.075 or less from the viewpoint that it is easy to selectively absorb light at the specific wavelength in the oblique direction and the oblique hue during the white display is easily improved. The value of Ax550(z=50) is preferably 0.080 or more and more preferably 0.100 or more, and preferably 0.800 or less and more preferably 0.500 or less. Furthermore, the value of Ax650(z=50) is preferably 0.080 or more and more preferably 0.100 or more, and is preferably 0.800 or less and more preferably 0.500 or less.

In the optically anisotropic film (b), the value of Ax450 (z=50) is 0.050 or more and 1.00 or less and the value of Ax550(z=50) is 0.070 or more and 1.000 or less, and the value of Ax650(z=50) is 0.001 or more and 0.1 or less. In the optically anisotropic film (b), the value of Ax450(z=50) is preferably 0.060 or more, more preferably 0.070 or more, still more preferably 0.080 or more, particularly preferably 0.100 or more, and is preferably 0.800 or less and more preferably 0.500 or less because light of the specific wavelength in the oblique direction is easily absorbed selectively and the oblique hue during white display is easily improved. Furthermore, the value of Ax550(z=50) is preferably 0.080 or more, more preferably 0.090 or more, and still more preferably 0.100 or more, and is preferably 0.800 or less and more preferably 0.500 or less. Furthermore, the value of Ax650(z=50) is preferably 0.005 or more and more preferably 0.010 or more, and is preferably 0.080 or less and more preferably 0.075 or less.

In the optically anisotropic film (a) and the optically anisotropic film (b), the values of Ax450, Ax550, and Ax650 are all 0.001 or more and 0.050 or less. In the optically anisotropic film (a), the values of Ax450, Ax550, and Ax650 are preferably all 0.001 or more and 0.050 or less. From the viewpoint of improving the front hue during white display, all of the values of Ax450, Ax550, and Ax650 are preferably 0.040 or less, more preferably 0.030 or less, and still more preferably 0.025 or less.

The values of $Ax\lambda$ and $Ax\lambda(z=50)$ in the optically anisotropic film can be controlled by, for example, the kind and blending amount of the dichroic dye constituting the optically anisotropic film. In addition, for example, it can also be controlled by adjusting the film thickness of the optically anisotropic film, the conditions of the production process, the kind and blending amount of the polymerizable liquid crystal compound constituting the optically anisotropic film, and the like.

The optically anisotropic film of the present invention contains at least two dichroic dyes. The dichroic dye refers to a dye having a property that the absorbance in a major axis direction of a molecule is different from the absorbance in a minor axis direction of the molecule. The dichroic dye is not limited as long as it has such properties, and may be a dye or a pigment. Two or more dyes may be used in combination, two or more pigments may be used in combination, or a dye and a pigment may be used in combination.

In order for the optically anisotropic layer to satisfy the optical characteristics represented by Formulae (1) to (3) or Formulae (7) to (9), it is preferable that the at least two dichroic dyes constituting the optically anisotropic film of the present invention usually contain two different dichroic dyes selected from the group consisting of a cyan dye, a magenta dye, and a yellow dye. Here, in the present specification, the cyan dye refers to a dichroic dye having a maximum absorption within a wavelength of 570 nm to 700 nm. The magenta dye refers to a dichroic dye having a maximum absorption at a wavelength of 480 nm or more and less than 570 nm. The yellow dye refers to a dichroic dye having a maximum absorption at a wavelength of 380 nm or more and less than 480 nm. In the present invention, the phrase "containing two different kinds of dichroic dyes" means including at least two dichroic dyes selected from different dye groups classified into a cyan dye, a magenta dye, or a yellow dye, such as a combination of a cyan dye and a magenta dye or a combination of a magenta dye and a yellow dye. Therefore, when, for example, only two or more dichroic dyes both belonging to a cyan dye are contained as the dichroic dyes constituting the optically anisotropic film, it does not mean that the optically anisotropic film "contains at least two kinds of dichroic dyes" in the meaning of the present specification. The absorbance of the dichroic dye can be measured by a spectrophotometer in a state where the dichroic dye such as chloroform is dissolved in a solvent that dissolves the dichroic dye.

The at least two dichroic dyes are preferably a combination of at least one cyan dye and at least one magenta dye (hereinafter, also referred to as "combination (a)") or a combination of at least one yellow dye and at least one magenta dye (hereinafter, also referred to as "combination (b)"). By including the combination (a) as the dichroic dye, an optically anisotropic film satisfying Formulae (2) and (3) can be prepared. In addition, by including the combination (b) as the dichroic dye, an optically anisotropic film satisfying Formulae (7) and (8) can be prepared. When the optically anisotropic film contains the combination (a) as the dichroic dye, it is preferable that the yellow dye is substantially not contained in order to impart desired optical characteristics (that is, the optical characteristics satisfying Formula (1)) to the optically anisotropic film. Such an optically anisotropic film can be the optically anisotropic film (a). Similarly, when the optically anisotropic film contains the combination (b) as the dichroic dye, it is preferable that the cyan dye is substantially not contained in order to impart desired optical characteristics (that is, the optical characteristics satisfying Formula (9)) to the optically anisotropic film. Such an optically anisotropic film can be the optically anisotropic film (b). Here, "substantially not contained" means that the content of a target dye is 0.25 parts by mass or less and preferably 0.10 parts by mass or less, based on 100 parts by mass of the polymerizable liquid crystal compound that forms the optically anisotropic film, and the content of the target dye may be 0 parts by mass. As long as the optically anisotropic film satisfies Formulae (1) to (3) or Formulae (7) to (9), a small amount of yellow dye may be contained together with the combination (a), and a small amount of cyan dye may be contained together with the combination (b).

In the present invention, the optically anisotropic film preferably satisfies any one of the following Formulae (10) and (11).

$$0.1 \leq Ax450(z=50)/Ax550(z=50) \leq 1.5 \quad (10)$$

$$0.1 \leq Ax650(z=50)/Ax550(z=50) \leq 1.5 \quad (11)$$

[in Formulae (10) and (11), $Ax\lambda(z=50)$ has the same meaning as described above]

The above Formula (10) shows that a ratio of the absorbance at a wavelength of 450 nm to the absorbance at a wavelength of 550 nm in the oblique direction of the optically anisotropic film is 0.1 or more and 1.5 or less. In addition, the above Formula (11) shows that a ratio of the absorbance at a wavelength of 650 nm to the absorbance at a wavelength of 550 nm in the oblique direction of the optically anisotropic film is 0.1 or more and 1.5 or less. When the optically anisotropic film satisfies any one of Formulae (10) and (11), the selective absorbency for the light having a specific wavelength in the oblique direction is enhanced, and the oblique hue during the white display is easily improved. In particular, when the optically anisotropic film is the optically anisotropic film (a), it preferably satisfies Formula (11), and when the optically anisotropic film is the optically anisotropic film (b), it preferably satisfies Formula (10). Since the oblique hue during the white display is more easily improved, the value of $Ax450(z=50)/Ax550(z=50)$ is more preferably 0.2 or more and still more preferably 0.3 or more, and is more preferably 1.2 or less and still more preferably 1.0 or less. Similarly, since the oblique hue during the white display is more easily improved, the value of $Ax650(z=50)/Ax550(z=50)$ is more preferably 0.3 or more and still more preferably 0.4 or more, and is more preferably 1.4 or less and still more preferably 1.3 or less.

The value of $Ax450(z=50)/Ax550(z=50)$ and the value of $Ax650(z=50)/Ax550(z=50)$ can be controlled by adjusting the kind and blending amount of the dichroic dye constituting the optically anisotropic film. Specifically, an optically anisotropic film satisfying Formula (10) is obtained by using a yellow dye and a magenta dye as dichroic dyes and adjusting the blending ratio thereof. Further, an optically anisotropic film satisfying Formula (11) is obtained by using a cyan dye and a magenta dye as dichroic dyes and adjusting the blending ratio thereof.

In the present invention, the content of each of the at least two dichroic dyes can be appropriately determined according to the desired optical characteristics of the optically anisotropic film and the kind of the display constituting the display device incorporating the optically anisotropic film. In one aspect of the present invention, the optically anisotropic film of the present invention is preferably formed of a polymerizable liquid crystal composition containing the at least two dichroic dyes in an amount of 0.1 parts by mass or more and 5 parts by mass or less, based on 100 parts by mass of the polymerizable liquid crystal compound, when a film thickness is 0.1 μm or more and 5 μm or less. When the content of each dichroic dye is within the above range, the absorbance of the optically anisotropic film is easily controlled within a desired range, and an optically anisotropic film excellent in the oblique hue during the white display is obtained. In the optically anisotropic film of the present invention, the content of the dichroic dye is more preferably 0.3 parts by mass or more and still more preferably 0.5 parts by mass or more, and more preferably 4.5 parts by mass or less and still more preferably 4 parts by mass or less, based on 100 parts by mass of the polymerizable liquid crystal compound. When two or more dichroic dyes of the same kind classified into cyan dyes, magenta dyes, or yellow dyes are contained (that is, for example, in a case of containing a plurality of dichroic dyes classified into the cyan dyes), the total content of the dichroic dyes of the same kind is preferably within the above range.

When the optically anisotropic film is the optically anisotropic film (a), the film thickness is preferably 0.1 µm or more and 5 µm or less, and the magenta dye and the cyan dye are each contained in an amount of 0.1 parts by mass or more and 5 parts by mass or less, based on 100 parts by mass of the polymerizable liquid crystal compound. In the optically anisotropic film (a) having the above-mentioned film thickness, the content of the cyan dye (in the case of containing two or more kinds, the total content thereof) is preferably 0.3 parts by mass or more and more preferably 0.5 parts by mass or more, and is preferably 4.5 parts by mass or less and more preferably 4 parts by mass or less. In addition, in the optically anisotropic film (a) having the above-mentioned film thickness, the content of the magenta dye (in the case of containing two or more kinds, the total content thereof) is preferably 0.3 parts by mass or more and more preferably 0.5 parts by mass or more, and is preferably 4.5 parts by mass or less and more preferably 4 parts by mass or less.

When the optically anisotropic film is the optically anisotropic film (b), the film thickness is preferably 0.1 µm or more and 5 µm or less, and the magenta dye and the yellow dye are each contained in an amount of 0.1 parts by mass or more and 5 parts by mass or less, based on 100 parts by mass of the polymerizable liquid crystal compound. In the optically anisotropic film (a) having the above-mentioned film thickness, the content of the yellow dye (in the case of containing two or more kinds, the total content thereof) is preferably 0.3 parts by mass or more and more preferably 0.5 parts by mass or more, and is preferably 4.5 parts by mass or less and more preferably 4 parts by mass or less. In addition, in the optically anisotropic film (a) having the above-mentioned film thickness, the content of the magenta dye (in the case of containing two or more kinds, the total content thereof) is preferably 0.3 parts by mass or more and more preferably 0.5 parts by mass or more, and is preferably 4.5 parts by mass or less and more preferably 4 parts by mass or less.

When the displays constituting the display device are the same, the absorbance of the optically anisotropic film necessary for improving the oblique hue during the white display in the display device into which the display is incorporated is the same (constant). Therefore, the content of the dichroic dye in the optically anisotropic film of the present invention can be defined based on the amount of the polymerizable liquid crystal compound constituting the optically anisotropic film in relation to the film thickness of the optically anisotropic film.

In the present invention, wherein the at least two dichroic dyes contain a combination of at least one cyan dye and at least one magenta dye or a combination of at least one yellow dye and at least one magenta dye, it is preferable to satisfy Formula (12) and Formula (13) below:

$T \times D1 = 0.4$ to $1.7$ (12), and $T \times D2 = 0.6$ to $2.7$ (13).

In Formulae (12) and (13), T represents a film thickness (µm), D1 represents an amount (parts by mass) of a cyan dye or a yellow dye based on 100 parts by mass of the polymerizable liquid crystal compound, and D2 represents an amount (parts by mass) of a magenta dye based on 100 parts by mass of the polymerizable liquid crystal compound. When the optically anisotropic film satisfies the above Formulae (12) and (13), the absorbance of the optically anisotropic film is easily controlled within a desired range, and an optically anisotropic film excellent in the oblique hue during the white display is easily obtained. The value of $T \times D1$ is more preferably 0.5 or more and still more preferably 0.7 or more, and more preferably 1.6 or less and still more preferably 1.3 or less from the viewpoint that the oblique hue during the white display is more easily improved. Similarly, the value of $T \times D2$ is more preferably 0.8 or more and still more preferably 1.0 or more, and more preferably 2.5 or less and still more preferably 2.2 or less.

In the present invention, the dichroic dye is not particularly limited as long as it can form an optically anisotropic film that can satisfy Formulae (1) to (3) or (7) to (9), and dichroic dyes known in the field of optical films can be used. Examples of such dichroic dyes include acridine dyes, oxazine dyes, cyanine dyes, naphthalene dyes, azo dyes and anthraquinone dyes. Among them, azo dyes are preferable. Examples of the azo dyes include a monoazo dye, a bisazo dye, a trisazo dye, a tetrakisazo dye, and a stilbene azo dye, and a bisazo dye and a trisazo dye are preferable.

Examples of the azo dye include a compound (hereinafter, may be referred to as "compound (I)") represented by Formula (I).

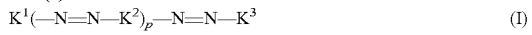

[in Formula (I), $K^1$ and $K^3$ each independently represent a phenyl group op which may have a substituent, a naphthyl group which may have a substituent, a benzoic acid phenyl ester group which may have a substituent, or a monovalent heterocyclic group which may have a substituent. $K^2$ represents a p-phenylene group which may have a substituent, a naphthalene-1,4-diyl group which may have a substituent, a 4,4'-stilbenylene group which may have a substituent, or a divalent heterocyclic group which may have a substituent. p represents an integer of 0 to 4. When p is an integer of 2 or more, a plurality of $K^2$s may be the same as or different from each other. A —N=N— bond may be substituted with a —C=C—, —COO—, —NHCO—, or a —N=CH— bond in a range indicating absorption in the visible range.]

Examples of the monovalent heterocyclic group include groups obtained by removing one hydrogen atom from heterocyclic compounds such as quinoline, thiazole, benzothiazole, thienothiazole, imidazole, benzimidazole, oxazole, and benzoxazole. Examples of the divalent heterocyclic group include groups obtained by removing two hydrogen atoms from the heterocyclic compound.

Examples of the substituents optionally possessed by the phenyl group, the naphthyl group, a benzoic acid phenyl ester group, and the monovalent heterocyclic group in $K^1$ and $K^3$, and the p-phenylene group, the naphthalene-1,4-diyl group, a 4,4'-stilbenylene group, and the divalent heterocyclic group in $K^2$ include an alkyl group having 1 to 20 carbon atoms, an alkyl group having 1 to 20 carbon atoms and having a polymerizable group, and an alkenyl group having 1 to 4 carbon atoms; an alkoxy group having 1 to 20 carbon atoms, such as a methoxy group, an ethoxy group, or a butoxy group; an alkoxy group having 1 to 20 carbon atoms and having a polymerizable group; a fluorinated alkyl group having 1 to 4 carbon atoms, such as a trifluoromethyl group; a cyano group; a nitro group; a halogen atom; a substituted or unsubstituted amino group such as an amino group, a diethylamino group, or a pyrrolidino group (the substituted amino group means an amino group having one or two alkyl groups having 1 to 6 carbon atoms, an amino group having one or two alkyl groups having 1 to 6 carbon atoms having a polymerizable group, or an amino group in which two substituted alkyl groups are bonded to each other to form an alkanediyl group having 2 to 8 carbon atoms. The unsubstituted amino group is —NH$_2$.). Examples of the polymerizable group include a (meth)acryloyl group and a (meth)acryloyloxy group.

Among the compounds (I), compounds represented by any of the following Formulae (I-1) to (I-8) are preferable.

[Chem. 1]
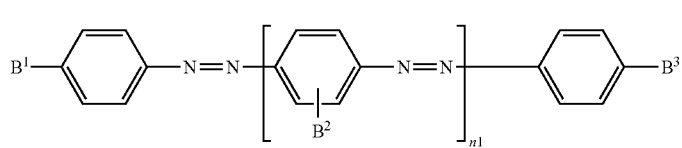
(I-1)
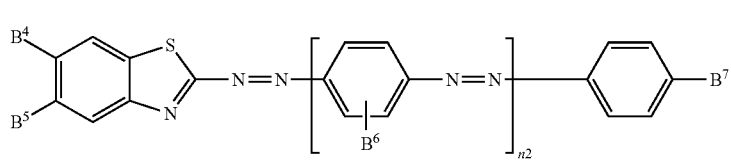
(I-2)
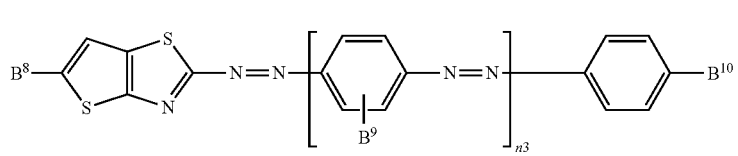
(I-3)
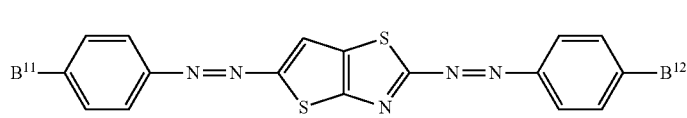
(I-4)
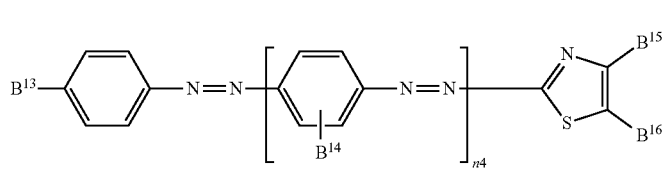
(I-5)
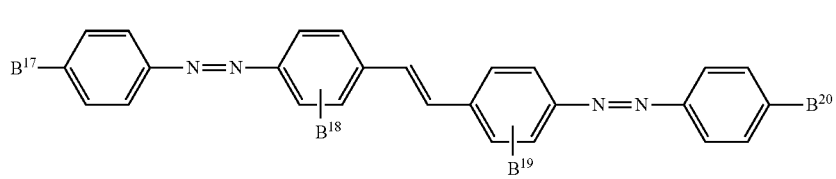
(I-6)
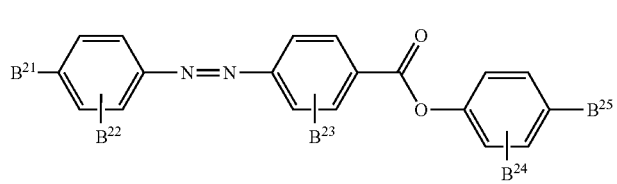
(I-7)
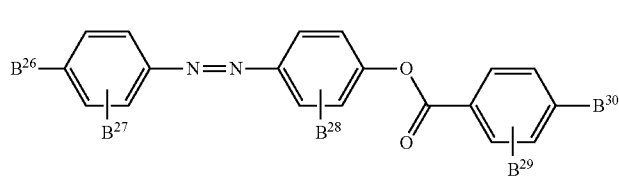
(I-8)

[in Formulae (I-1) to (I-8), $B^1$ to $B^{30}$ each independently represent a hydrogen atom, an alkyl group having 1 to 6 carbon atoms, an alkenyl group having 1 to 6 carbon atoms, an alkoxy group having 1 to 4 carbon atoms, a cyano group, a nitro group, a substituted or unsubstituted amino group (the definition of the substituted amino group and the unsubstituted amino group is as described above), a chlorine atom, or a trifluoromethyl group.

n1 to n4 each independently represent an integer of 0 to 3.

When n1 is 2 or more, a plurality of $B^2$s may be the same as or different from each other, When n2 is 2 or more, a plurality of $B^6$s may be the same as or different from each other, When n3 is 2 or more, a plurality of $B^9$s may be the same as or different from each other, and When n4 is 2 or more, a plurality of $B^{14}$s may be the same as or different from each other.]

The anthraquinone dye is preferably a compound represented by Formula (I-9).

[Chem. 2]

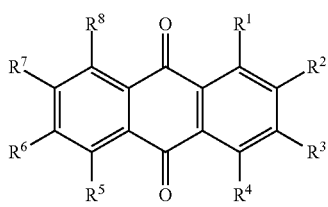

(I-9)

[in Formula (I-9), $R^1$ to $R^6$ each independently represent a hydrogen atom, $-R^x$, $-NH_2$, $-NHR^x$, $-NR^x_2$, $-SR^x$, or a halogen atom.

$R^x$ represents an alkyl group having 1 to 6 carbon atoms or an aryl group having 6 to 12 carbon atoms.]

The oxazine dye is preferably a compound represented by Formula (I-10).

[Chem. 3]

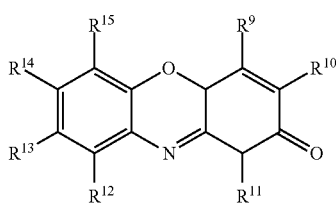

(I-10)

[in Formula (I-10), $R^9$ to $R^{15}$ each independently represent a hydrogen atom, $-R^x$, $-NH_2$, $-NHR^x$, $-NR^x_2$, $-SR^x$, or a halogen atom.

$R^x$ represents an alkyl group having 1 to 6 carbon atoms or an aryl group having 6 to 12 carbon atoms.]

The acridine dye is preferably a compound represented by Formula (I-11).

[Chem. 4]

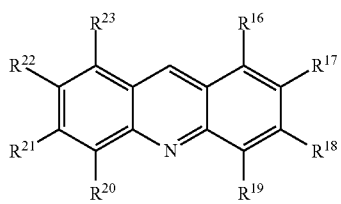

(I-11)

[in Formula (I-11), $R^{16}$ to $R^{23}$ each independently represent a hydrogen atom, $-R^x$, $-NH_2$, $-NHR^x$, $-NR^x_2$, $-SR^x$, or a halogen atom.

$R^x$ represents an alkyl group having 1 to 6 carbon atoms or an aryl group having 6 to 12 carbon atoms.]

Examples of the alkyl group having 1 to 6 carbon atoms represented by $R^x$ in Formula (I-9), Formula (I-10) and Formula (I-11) include a methyl group, an ethyl group, a propyl group, a butyl group, a pentyl group, and a hexyl group, and examples of the aryl group having 6 to 12 carbon atoms include a phenyl group, a tolyl group, a xylyl group, and a naphthyl group.

The cyanine dye is preferably a compound represented by Formula (I-12) and a compound represented by Formula (I-13).

[Chem. 5]

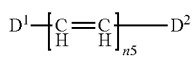

(I-12)

[in Formula (I-12), $D^1$ and $D^2$ each independently represent a group represented by any one of Formulae (I-12a) to (I-12d).

[Chem. 6]

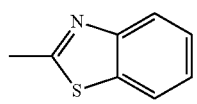

(I-12a)

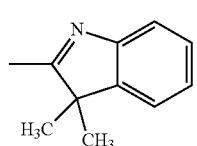

(I-12b)

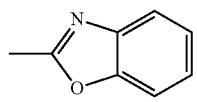

(I-12c)

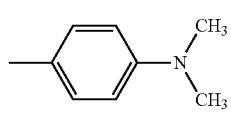

(I-12d)

n5 represents an integer of 1 to 3.]

[Chem. 7]

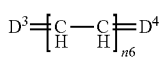
(I-13)

[in Formula (I-13),

D³ and D⁴ each independently represent a group represented by any one of Formulae (I-13a) to (I-13h).

[Chem. 8]

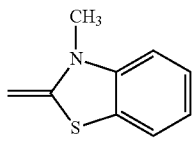
(I-13a)

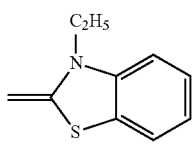
(I-13b)

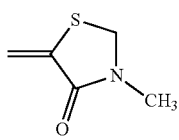
(I-13c)

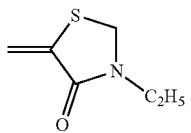
(I-13d)

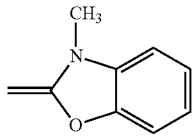
(I-13e)

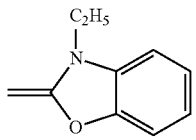
(I-13f)

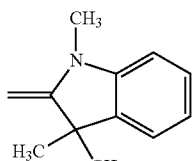
(I-13g)

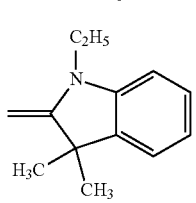
(I-13h)

n6 represents an integer of 1 to 3.]

Specific examples of the dichroic dye as described above include compounds as described in JP-A-2013-210624. From these dichroic dyes, a dichroic dye in a desired wavelength range can be appropriately selected and used so as to satisfy the above Formulae (1) to (3) or Formulae (7) to (9).

Among the dichroic dyes as described above, an azo dye has high linearity, and thus is excellent in orientation, and is suitable for producing an optically anisotropic film excellent in the polarizing performance. In the present invention, at least one of at least two dichroic dyes constituting the optically anisotropic film is preferably an azo dye, and at least two are more preferably an azo dye.

The weight average molecular weight of the dichroic dye is usually 300 to 2,000 and preferably 400 to 1,000.

The polymerizable liquid crystal compound (hereinafter, also referred to as "polymerizable liquid crystal compound (A)") contained in the composition for forming an optically anisotropic film for forming the optically anisotropic film of the present invention is a compound having at least one polymerizable group and having liquid crystallinity. Here, the polymerizable group means a group involved in a polymerization reaction, and is preferably a photopolymerizable group. The photopolymerizable group refers to a group that can be involved in a polymerization reaction by active radical, acid, and the like generated from a polymerization initiator. Examples of the polymerizable group of the polymerizable liquid crystal compound include a vinyl group, a vinyloxy group, a 1-chlorovinyl group, an isopropenyl group, a 4-vinylphenyl group, an acryloyloxy group, a methacryloyloxy group, an oxylanyl group, and an oxetanyl group. Among them, a radical polymerizable group is preferable, an acryloyloxy group, a methacryloyloxy group, a vinyloxy group, an oxylanyl group, and an oxetanyl group are more preferable, and an acryloyloxy group is still more preferable.

In the present invention, the polymerizable liquid crystal compound is preferably a liquid crystal compound exhibiting a smectic liquid crystalline phase. When the polymerizable liquid crystal compound exhibiting a smectic liquid crystal phase is used, the polymerizable liquid crystal compound tends to be oriented with a high degree of order, and the absorbance of the optically anisotropic film is easily controlled within the range represented by Formulae (4) to (6). As a result, the optically anisotropic film excellent in the front hue during the white display can be formed. From the viewpoint of achieving a high degree of orientation order, the liquid crystal state exhibiting the polymerizable liquid crystal compound (A) is more preferably a higher order smectic phase (higher order smectic liquid crystal state). Here, the higher order smectic phase means a smectic B phase, a smectic D phase, a smectic E phase, a smectic F phase, a smectic G phase, a smectic H phase, a smectic I phase, a smectic J phase, a smectic K phase, or a smectic L phase, and among these phases, a smectic B phase, a smectic F phase, and a smectic I phase are more preferable. The liquid crystallinity may be a thermotropic liquid crystal or a lyotropic liquid crystal, but a thermotropic liquid crystal is preferable from the viewpoint of enabling dense film thickness control. The polymerizable liquid crystal compound (A) may be a monomer, but may be an oligomer in which a polymerizable group is polymerized or a polymer.

As the polymerizable liquid crystal compound (A), a liquid crystal compound having at least one polymerizable group can be used. Examples of such a polymerizable liquid crystal compound include a compound represented by the following Formula (A) (hereinafter, also referred to as "polymerizable liquid crystal compound (A)").

$$U^1\text{—}V^1\text{—}W^1\text{—}(X^1\text{—}Y^1)_n\text{—}X^2\text{—}W^2\text{—}V^2\text{—}U^2 \quad (A)$$

[in Formula (A), $X^1$ and $X^2$ each independently represent a divalent aromatic group or a divalent alicyclic hydrocarbon group, wherein a hydrogen atom contained in the divalent aromatic group or the divalent alicyclic hydrocarbon group may be substituted with a halogen atom, an alkyl group having 1 to 4 carbon atoms, a fluoroalkyl group having 1 to 4 carbon atoms, an alkoxy group having 1 to 4 carbon atoms, a cyano group, or a nitro group, and a carbon atom constituting the divalent aromatic group or the divalent alicyclic hydrocarbon group may be substituted with an oxygen atom, a sulfur atom, or a nitrogen atom. However, at least one of $X^1$ and $X^2$ is a 1,4-phenylene group which may have a substituent or a cyclohexane-1,4-diyl group which may have a substituent.

$Y^1$ is a single bond or a divalent linking group.

When n is 1 to 3 and n is 2 or more, a plurality of $X^1$s may be the same as or different from each other. $X^2$ may be the same as or different from any or all of the plurality of $X^1$s. When n is 2 or more, a plurality of $Y^1$s may be the same as or different from each other. From the viewpoint of the liquid crystallinity, n is preferably 2 or more.

$U^1$ represents a hydrogen atom or a polymerizable group.

$U^2$ represents a polymerizable group.

$W^1$ and $W^2$ are independently of each other a single bond or a divalent linking group.

$V^1$ and $V^2$ each independently represent an alkanediyl group having 1 to 20 carbon atoms which may have a substituent, and —$CH_2$— constituting the alkanediyl group may be substituted with —O—, —CO—, —S— or NH—.]

In the polymerizable liquid crystal compound (A), $X^1$ and $X^2$ are each independently preferably a 1,4-phenylene group which may have a substituent or a cyclohexane-1,4-diyl group which may have a substituent, and at least one of $X^1$ and $X^2$ is a 1,4-phenylene group which may have a substituent or a cyclohexane-1,4-diyl group which may have a substituent, and is preferably a trans-cyclohexane-1,4-diyl group. Examples of the substituent optionally possessed by a 1,4-phenylene group which may have a substituent or a cyclohexane-1,4-diyl group which may have a substituent include alkyl groups having 1 to 4 carbon atoms such as a methyl group, an ethyl group, and a butyl group, a cyano group, and halogen atoms such as a chlorine atom and a fluorine atom. It is preferably unsubstituted.

In the polymerizable liquid crystal compound (A), it is preferable that a portion [hereinafter, referred to as partial structure (A1)] represented by Formula (A1) in Formula (A) has an asymmetric structure in that the smectic liquid crystallinity, particularly, higher order smectic liquid crystallinity is easily exhibited, $$\text{—}(X^1\text{—}Y^1\text{—})_r\text{—}X^2\text{—} \quad (A1)$$

[in the formula, $X^1$, $Y^1$, $X^2$, and n have the same meaning as above].

Examples of the polymerizable liquid crystal compound (A) in which the partial structure (A1) is an asymmetric structure include a polymerizable liquid crystal compound (A) in which n is 1 and $X^1$ and $X^2$ are different structures from each other. Examples also include a polymerizable liquid crystal compound (A) in which n is 2, two $Y^1$s have the same structure as each other, two $X^1$s have the same structure as each other, one $X^2$ has a structure different from these two $X^1$s, and a polymerizable liquid crystal compound (Z) in which $X^1$ bonded to $W^1$ of two $X^1$s has a structure different from those of the other $X^1$ and X2, and the other $X^1$ and $X^2$ have the same structure as each other. Further, there is a polymerizable liquid crystal compound (Z) in which n is 3, three $Y^1$s have the same structure as each other, and any one of three $X^1$s and one $X^2$ has a structure different from all the other three.

$Y^1$ is preferably —$CH_2CH_2$—, —$CH_2O$—, —$CH_2CH_2O$—, —COO—, —OCOO—, a single bond, —N═N—, —$CR^a$═$CR^b$—, —C≡C—, —$CR^a$═N—, or —CO—$NR^a$—. $R^a$ and $R^b$ each independently represent a hydrogen atom or an alkyl group having 1 to 4 carbon atoms. $Y^1$ is preferably —$CH_2CH_2$—, —$CH_2O$—, —COO—, —OCOO—, a single bond, —N═N—, —$CR^a$═$CR^b$—, —C≡C—, or —$CR^a$═N—, $Y^1$ is more preferably —$CH_2CH_2$—, —COO—, or a single bond, and when there is a plurality of $Y^1$s, $Y^1$ bonded to $X^2$ is more preferably —$CH_2CH_2$— or —$CH_2O$—, and $Y^1$ which is not bonded to $X^2$ is still more preferably —$CH_2CH_2$—, —COO—, or a single bond. When $X^1$ and $X^2$ all have the same structure, it is preferable that there are two or more $Y^1$ that have different binding methods from each other. When a plurality of $Y^1$, which have different bonding methods from each other, are present, the structure is asymmetrical, so that smectic liquid crystallinity, particularly, higher order smectic liquid crystallinity tends to be easily exhibited.

$U^2$ is a polymerizable group. $U^1$ is a hydrogen atom or a polymerizable group, preferably a polymerizable group. Both $U^1$ and $U^2$ are preferably polymerizable groups, more preferably photopolymerizable groups, and still more preferably photoradical polymerizable groups. Examples of the polymerizable group include the same groups as those exemplified above as the polymerizable group of the polymerizable liquid crystal compound. The polymerizable group represented by $U^1$ and the polymerizable group represented by $U^2$ may be different from each other, and are preferably the same kind of group, and at least one of $U^1$ and $U^2$ is preferably a (meth)acryloyloxy group, both $U^1$ and $U^2$ are more preferably (meth)acryloyloxy groups, and still more preferably acryloyloxy groups. The polymerizable group may be in a polymerized state or in an unpolymerized state, but is preferably in an unpolymerized state.

Examples of the alkanediyl group represented by $V^1$ and $V^2$ include a methylene group, an ethylene group, a propane-1,3-diyl group, a butane-1,3-diyl group, a butane-1,4-diyl group, a pentane-1,5-diyl group, a hexane-1,6-diyl group, a heptane-1,7-diyl group, an octane-1,8-diyl group, a decane-1,10-diyl group, a tetradecane-1,14-diyl group, and an icosane-1,20-diyl group. $V^1$ and $V^2$ are preferably an alkanediyl group having 2 to 12 carbon atoms, and more preferably an alkanediyl group having 6 to 12 carbon atoms.

Examples of the substituent optionally included in the alkanediyl group include a cyano group and a halogen atom such as a chlorine atom or a fluorine atom, and the alkanediyl group is preferably unsubstituted and more preferably an unsubstituted linear alkanediyl group.

$W^1$ and $W^2$ are each independently preferably a single bond, —O—, —S—, —COO—, or —OCOO—, and more preferably a single bond or —O—.

As the structure of the polymerizable liquid crystal compound which easily exhibits the smectic liquid crystallinity, it is preferable to have an asymmetric molecular structure in the molecular structure, and specifically, it is more preferable to use a polymerizable liquid crystal compound which has the following partial structures (A-a) to (A-i) and exhibits the smectic liquid crystallinity. It is more preferable to have a partial structure of (A-a), (A-b), or (A-c) from the viewpoint of easily exhibiting higher order smectic liquid crystallinity. In the following (A-a) to (A-i), * represents a bond (single bond).

[Chem. 9]

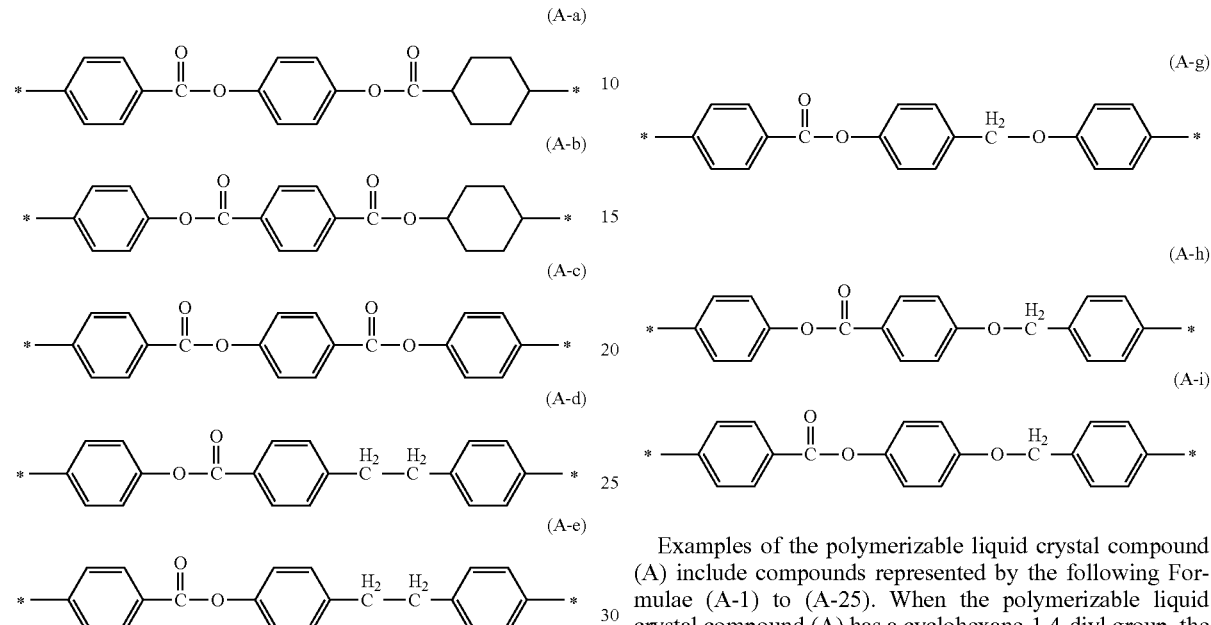

Examples of the polymerizable liquid crystal compound (A) include compounds represented by the following Formulae (A-1) to (A-25). When the polymerizable liquid crystal compound (A) has a cyclohexane-1,4-diyl group, the cyclohexane-1,4-diyl group is preferably a trans form.

[Chem. 10]

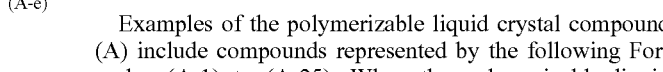

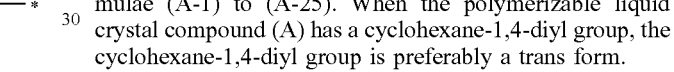

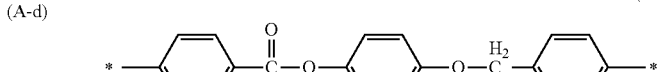

-continued
(A-6)
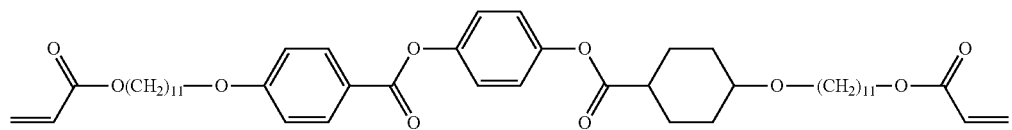
(A-7)
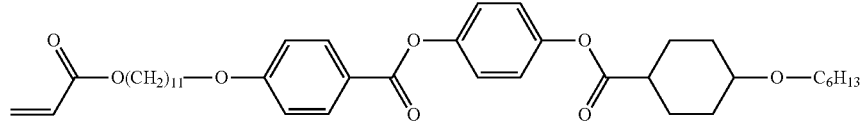
(A-8)
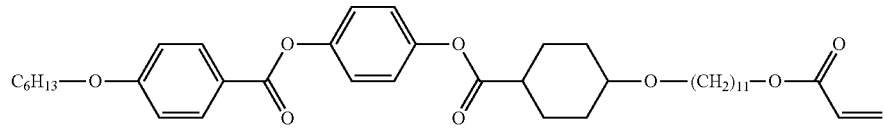
[Chem. 11]
(A-9)
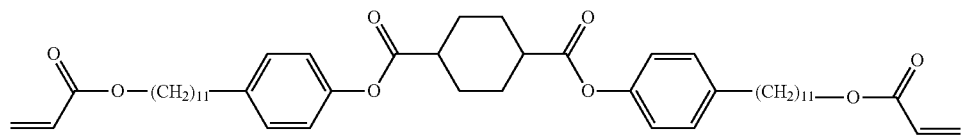
(A-10)
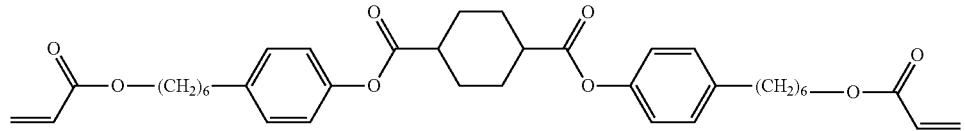
(A-11)
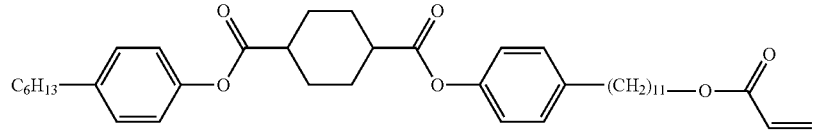
(A-12)
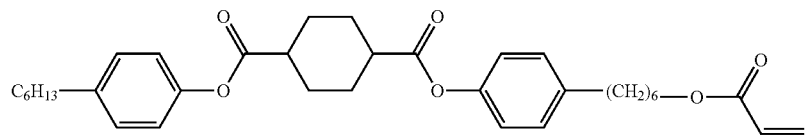
(A-13)
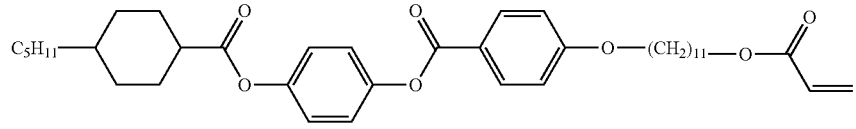
(A-14)
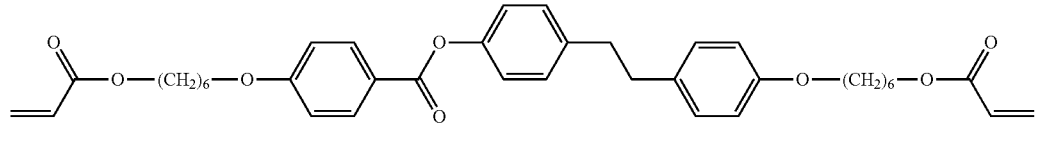
(A-15)
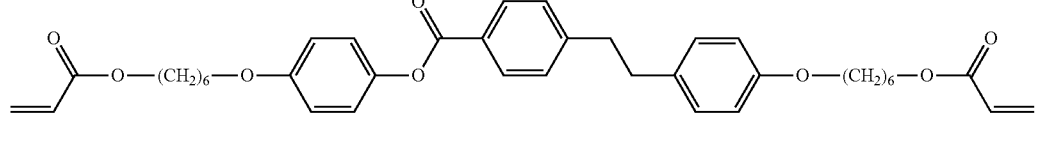
(A-16)
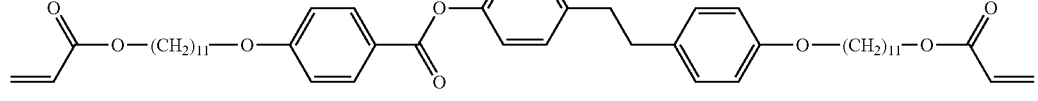

-continued

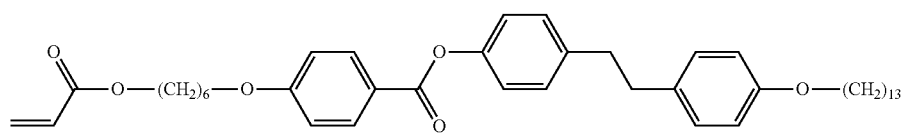
(A-17)

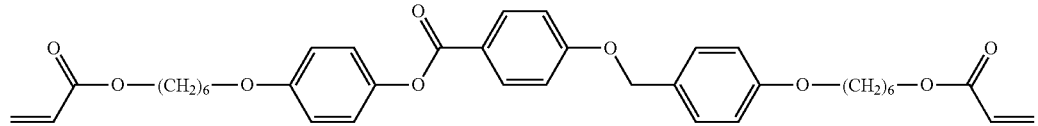
(A-18)

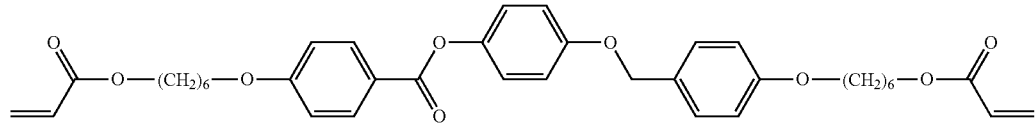
(A-19)

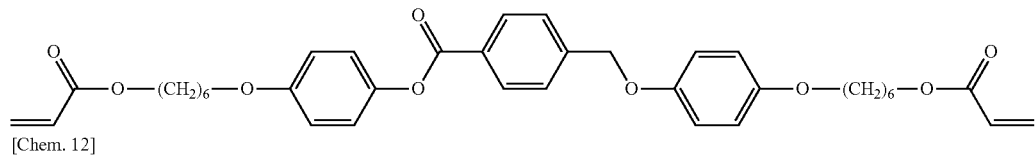
(A-20)

[Chem. 12]

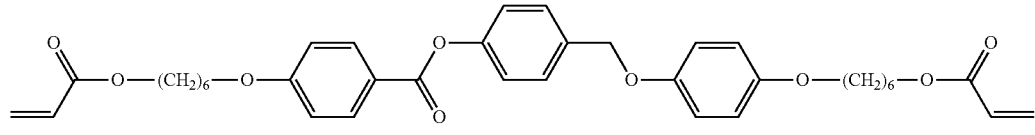
(A-21)

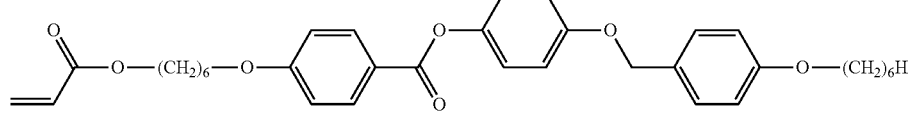
(A-22)

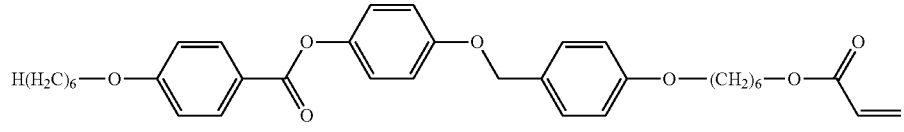
(A-23)

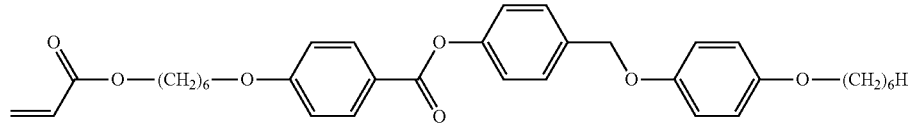
(A-24)

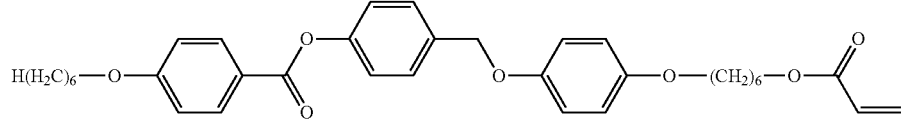
(A-25)

Among these, at least one selected from the group consisting of compounds represented by Formula (A-2), Formula (A-3), Formula (A-4), Formula (A-6), Formula (A-7), Formula (A-8), Formula (A-13), Formula (A-14), and Formula (A-15) is preferable. The polymerizable liquid crystal compound (A) may be used alone or in combination of two or more thereof.

The polymerizable liquid crystal compound (A) can be produced by a known method described in, for example, Lub et al, Recl. Trav. Chim. Pays-Bas, 115, 321-328 (1996), or Japanese Patent No. 4719156.

In the present invention, the optically anisotropic film is preferably formed to contain the polymerizable liquid crystal compound (A), and the composition for forming an optically anisotropic film preferably contains the polymerizable liquid crystal compound (A). When two or more kinds of polymerizable liquid crystal compounds are contained in the composition for forming an optically anisotropic film, the ratio of the polymerizable liquid crystal compound (A) to the total mass of the polymerizable liquid crystal compounds contained in the composition for forming an optically anisotropic film is preferably 51% by mass or more, more preferably 70% by mass or more, and still more preferably 90% by mass or more. When the proportion of the polymerizable liquid crystal compound (A) is within the above range, an optically anisotropic film having a high degree of orientation order is easily obtained.

When the composition for forming an optically anisotropic film contains two or more polymerizable liquid crystal compounds, at least one of them may be the polymerizable liquid crystal compound (A), and all of them may be the polymerizable liquid crystal compound (A). By combining a plurality of polymerizable liquid crystal compounds, the liquid crystallinity may be temporarily retained even at a temperature equal to or lower than a liquid-crystal phase transition temperature.

The content of the polymerizable liquid crystal compound in the composition for forming an optically anisotropic film is preferably 40 to 99.9%, by mass, more preferably 60 to 99% by mass, and still more preferably 70 to 99% by mass with respect to the solid content of the composition for forming an optically anisotropic film. When the content of the polymerizable liquid crystal compound is within the above range, the orientation of the polymerizable liquid crystal compound tends to be high. In the present specification, the solid content of the composition for forming an optically anisotropic film means the total amount of components excluding volatile substances such as solvents from the composition. Hereinafter, the solid content in other compositions and the like similarly refers to the total amount of components excluding volatile substances such as solvents from target compositions and the like.

The composition for forming an optically anisotropic film may contain a polymerization initiator. The polymerization initiator is a compound capable of initiating a polymerization reaction such as a polymerizable liquid crystal compound. As the polymerization initiator, a photopolymerization initiator that generates active radical or acid by the action of light is preferable in that a polymerization reaction can be initiated under lower temperature conditions, and a photopolymerization initiator that generates radical by the action of light is more preferable. The polymerization initiator may be used alone or in combination of two or more thereof.

As the photopolymerization initiator, a known photopolymerization initiator can be used, and examples of the photopolymerization initiator that generates active radical include a self-cleavage type photopolymerization initiator and a hydrogen abstraction type photopolymerization initiator.

As the self-cleaving type photopolymerization initiator, a self-cleaving type benzoin-based compound, an acetophenone-based compound, a hydroxyacetophenone-based compound, an a-aminoacetophenone-based compound, an oxime ester-based compound, an acylphosphine oxide-based compound, an azo-based compound, and the like can be used. In addition, as the hydrogen abstraction type photopolymerization initiator, a hydrogen abstraction type benzophenone-based compound, a benzoin ether-based compound, a benzyl ketal-based compound, a dibenzosuberone-based compound, an anthraquinone-based compound, a xanthone-based compound, a thioxanthone-based compound, a halogenoacetophenone-based compound, a dialkoxyacetophenone-based compound, a halogenobisimidazole-based compound, a halogenotriazine-based compound, a triazine-based compound, and the like can be used.

As the photopolymerization initiator that generates acid, an iodonium salt, a sulfonium salt, and the like can be used.

Among them, a reaction at a low temperature is preferable from the viewpoint of preventing dissolution of a dye, and a self-cleavage type photopolymerization initiator is preferable from the viewpoint of reaction efficiency at a low temperature, and particularly, an acetophenone-based compound, a hydroxyacetophenone-based compound, an a-aminoacetophenone-based compound, and an oxime ester-based compound are preferable.

Specific examples of the photopolymerization initiator include the following.

a benzoin-based compound such as benzoin, benzoin methyl ether, benzoin ethyl ether, benzoin isopropyl ether, and benzoin isobutyl ether;

a hydroxyacetophenone-based compound such as oligomer of 2-hydroxy-2-methyl-1-phenylpropane-1-one, 1,2-diphenyl-2,2-dimethoxyethane-1-one, 2-hydroxy-2-methyl-1-[4-(2-hydroxyethoxy) phenyl] propane-1-one, 1-hydroxycyclohexyl phenyl ketone, and 2-hydroxy-2-methyl-1-[4-(1-methylvinyl) phenyl] propane-1-one;

α-aminoacetophenone-based compound such as 2-methyl-2-morpholino-1-(4-methylthiophenyl) propane-1-one and 2-dimethylamino-2-benzyl-1-(4-morpholinophenyl) butane-1-one;

an oxime ester-based compound such as 1,2-octanedione, 1-[4-(phenylthio)-,2-(O-benzoyloxime)], ethanone, and 1-[9-ethyl-6-(2-methylbenzoyl)-9H-carbazole-3-yl]-,1-(O-acetyloxime); an acylphosphine oxide-based compound such as 2,4,6-trimethylbenzoyldiphenylphosphine oxide and bis(2,4,6-trimethylbenzoyl) phenylphosphine oxide;

a benzophenone compound such as benzophenone, methyl o-benzoylbenzoate, 4-phenylbenzophenone, 4-benzoyl-4'-methyldiphenylsulfide, 3,3',4,4'-tetra (tert-butylperoxycarbonyl) benzophenone, and 2,4,6-trimethylbenzophenone;

a dialkoxyacetophenone-based compound such as diethoxyacetophenone; and a triazine compound such as 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl) ethenyl]-1, 3,5-triazine, 2,4-bis(trichloromethyl)-6-[2-(furan-2-yl) ethenyl]-1,3,5-triazine, 2,4-bis(trichloromethyl)-6-[2-(4-diethylamino-2-methylphenyl) ethenyl]-1,3,5-triazine, and 2,4-bis(trichloromethyl)-6-[2-(3,4-dimethoxyphenyl) ethenyl]-1,3,5-triazine.

The photopolymerization initiator may be appropriately selected from the photopolymerization initiators described above, for example, in relation to a polymerizable liquid crystal compound that forms an optically anisotropic film.

In addition, a commercially available photopolymerization initiator may be used. Examples of the commercially available polymerization initiator include IRGACURE (registered trademark) 907, 184, 651, 819, 250, 369, 379, 127, 754, OXE01, OXE02, and OXE03 (available from BASF); Omnirad BCIM, Esacure 1001M, Esacure KIP160 (available from IDM Resins B.V.); SEIKUOL (registered trademark) BZ, Z, and BEE (available from Seiko Chemical Co., Ltd.); KAYACURE (registered trademark) BP100 and UVI-6992 (available from Nippon Kayaku Co., Ltd.); ADEKA OPTOMER SP-152, N-1717, N-1919, SP-170, ADEKA ARKLS NCI-831, ADEKA ARKLS NCI-930 (available from ADEKA Corporation); TAZ-A and TAZ-PP (available from DKSH Holding AG); and TAZ-104 (available from Sanwa Chemical Co., Ltd.) and the like.

The content of the polymerization initiator is preferably 0.1 to 20 parts by mass, more preferably 0.1 to 15 parts by mass, still more preferably 0.5 to 10 parts by mass, and particularly preferably 0.5 to 8 parts by mass, based on 100 parts by mass of the polymerizable liquid crystal compound. When the content of the polymerization initiator is within the above range, the polymerization reaction can be performed without greatly disturbing the orientation of the polymerizable liquid crystal compound.

The optically anisotropic film may contain a leveling agent. The leveling agent has a function of adjusting the fluidity of the composition for forming an optically anisotropic film and making a coating film obtained by applying the composition flatter, and specific examples thereof include surfactants. The leveling agent is preferably at least one selected from the group consisting of a leveling agent containing a polyacrylate compound as a main component and a leveling agent containing a fluorine atom-containing compound as a main component. The leveling agents can be used alone or in combination of two or more.

Examples of the leveling agent containing a polyacrylate compound as a main component include BYK-350, BYK-352, BYK-353, BYK-354, BYK-355, BYK-358N, BYK-361N, BYK-380, BYK-381, and BYK-392 (BYK Chemie).

Examples of the leveling agent containing a fluorine atom-containing compound as a main component include Megafac (registered trademark) R-08, R-30, R-90, F-410, F-411, F-443, F-445, F-470, F-471, F-477, F-479, F-482, and F-483 (DIC Corporation); Surflon (registered trademark) S-381, 5-382, S-383, 5-393, SC-101, SC-105, KH-40, and SA-100 (AGC Seimi Chemical Co., Ltd.); E1830 and E5844 (Daikin Industries, Ltd.); and EFTOP EF301, EFTOP EF303, EFTOP EF351, EFTOP EF352 (Mitsubishi Materials Electronic Chemicals Co., Ltd.).

When the optically anisotropic film contains the leveling agent, the content thereof is preferably 0.01 to 5 parts by mass, and more preferably 0.05 to 3 parts by mass, based on 100 parts by mass of the polymerizable liquid crystal compound.

When the content of the leveling agent is within the above range, the polymerizable liquid crystal compound is easily oriented, unevenness is hardly generated, and a smoother optically anisotropic film tends to be obtained.

The optically anisotropic film may contain an additive other than the leveling agent. Examples of other additives include colorants such as a photosensitizer, an antioxidant, a mold release agent, a stabilizer, and a bluing agent, a flame retardant, and a lubricant. When other additives are contained, the content of the other additives is preferably more than 0% and 20% by mass or less, and more preferably more than 0% and 10% by mass or less, with respect to the solid content of the composition for forming an optically anisotropic film.

The composition for forming an optically anisotropic film can be produced by a known method for preparing a liquid crystal composition in the related art, and usually can be prepared by mixing and stirring a polymerizable liquid crystal compound, a dichroic dye, and, if necessary, a polymerization initiator, the above-described additives, and the like. In general, since a liquid crystal compound exhibiting the smectic liquid crystallinity has high viscosity, viscosity adjustment may be performed by adding a solvent to the composition for forming an optically anisotropic film from the viewpoint of improving the coatability of the composition to facilitate the formation of an optically anisotropic film.

The solvent may be appropriately selected according to the solubility of the polymerizable liquid crystalline compound and the dichroic dye to be used, and is preferably a solvent that can completely dissolve the components and is inert to the polymerization reaction.

Examples of the solvent include alcohol solvents such as methanol, ethanol, ethylene glycol, isopropyl alcohol, propylene glycol, ethylene glycol methyl ether, ethylene glycol butyl ether, and propylene glycol monomethyl ether; ester solvents such as ethyl acetate, butyl acetate, ethylene glycol methyl ether acetate, γ-butyrolactone or propylene glycol methyl ether acetate, and ethyl lactate; ketone solvents such as acetone, methyl ethyl ketone, cyclopentanone, cyclohexanone, 2-heptanone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetrahydrofuran and dimethoxyethane; and chlorine-containing solvents such as chloroform and chlorobenzene. These solvents may be used alone or in combination of two or more thereof.

The content of the solvent is preferably 50 to 98 parts by mass, and more preferably 70 to 95 parts by mass, based on 100 parts by mass of the composition for forming an optically anisotropic film. Therefore, the solid content in 100 parts by mass of the composition for forming an optically anisotropic film is preferably 2 to 50 parts by mass. When the solid content is 50 parts by mass or less, since the viscosity of the composition for forming an optically anisotropic film is low, the thickness of the film tends to be substantially uniform, and unevenness tends to be less likely to occur. The solid content can be appropriately determined in consideration of the thickness of the optically anisotropic film to be produced.

The optically anisotropic film of the present invention is a film in which a polymerizable liquid crystal compound and at least two kinds of dichroic dyes are cured in a state of being oriented in a vertical direction with respect to a film plane, and usually, when an optional direction in-plane of the optically anisotropic film is defined as an x-axis, a direction orthogonal to the x-axis in-plane is defined as a y-axis, and a film thickness direction orthogonal to the x-axis and the y-axis is defined as a z-axis, it is preferable to satisfy the following Formula (14).

$$Az > (Ax + Ay)/2 \tag{14}$$

[wherein Ax, Ay, and Az are absorbances at the absorption maximum wavelength of the dichroic dye in the optically anisotropic film, Ax represents an absorbance of linearly polarized light that oscillates in an x-axis direction, Ay represents an absorbance of linearly polarized light that oscillates in a y-axis direction, and Az represents an absorbance of linearly polarized light that oscillates in a z-axis direction.]

Ax can be measured by entering the linearly polarized light oscillating in the x-axis direction from the z-axis direction toward the film surface. Ay can be measured by entering the linearly polarized light oscillating in the y-axis direction from the z-axis direction toward the film surface. Az can be measured, for example, by entering the linearly polarized light oscillating in the z-axis direction from a x-y plane direction toward the film side surface, that is, perpendicularly toward the side surface (thickness direction) when the optically anisotropic film is set as an x-y plane.

By using a compound that forms a smectic liquid crystal phase, particularly a higher order smectic liquid crystal phase, as the polymerizable liquid crystal compound, it is possible to obtain an optically anisotropic film in which the polymerizable liquid crystal compound and at least two kinds of dichroic dyes are easily oriented with high order in the vertical direction with respect to the film plane, which is excellent in light transmittance from the front direction, and which can effectively absorb the light having a specific wavelength from the oblique direction.

The thickness of the optically anisotropic film may be, for example, 0.05 µm to 5 µm, preferably 0.1 µm or more, more preferably 0.3 µm or more, and preferably 3 µm or less, more preferably 2 µm or less. When the thickness of the optically anisotropic film is the above lower limit or more, light absorption from an oblique direction is improved, and the oblique hue during the white display is easily improved. When the thickness is the above upper limit or less, the orientation of the polymerizable liquid crystal compound and the dichroic dye is hardly disturbed, high transmittance in the front direction can be secured, and thinning when incorporated in a display device or the like can be expected. The thickness of the optically anisotropic film can be measured by a laser microscope, a film thickness meter, or the like, and the same applies to the measurement of the thickness of each layer constituting a laminate including the optically anisotropic film.

In the present invention, the optically anisotropic film is preferably a liquid crystal cured film having a high degree of orientation order.

In the liquid crystal cured film having a high degree of orientation order, Bragg peaks derived from higher order structures such as a hexatic phase and a crystal phase are obtained in X-ray diffraction measurement. The Bragg peak means a peak derived from a plane periodic structure of molecular orientation. Therefore, it is preferable that the optically anisotropic film of the present invention exhibits a Bragg peak in X-ray diffraction measurement. That is, in the optically anisotropic film of the present invention, it is preferable that the polymerizable liquid crystal compound or a polymer thereof is oriented so that the film exhibits a Bragg peak in X-ray diffraction measurement. In the present invention, an optically anisotropic film having a molecular orientation plane cycle spacing of 3.0 to 6.0 Å is preferable. The high degree of orientation order exhibiting a Bragg peak can be achieved by controlling the kind of the polymerizable liquid crystal compound to be used, the kind and amount of the dichroic dye, the kind and amount of the polymerization initiator, and the like.

In the present invention, the optically anisotropic film is obtained by orienting an absorption axis of the dichroic dye in a direction orthogonal to the film surface. The direction of the absorption axis of the dichroic dye in such a host-guest type optically anisotropic film is usually controlled by the direction in which the polymerizable liquid crystal compound is oriented. When the orientation direction of a major molecular axis of the polymerizable liquid crystal compound is a direction orthogonal to the film surface, the absorption axis of the dichroic dye can be usually oriented in the direction orthogonal to the film surface. The orientation direction of the polymerizable liquid crystal compound can be controlled by the properties of the substrate or the oriented film to which the composition for forming an optically anisotropic film containing the polymerizable liquid crystal compound and the dichroic dye is applied, the properties of the polymerizable liquid crystal compound, and the like.

The optically anisotropic film of the present invention can be produced by a method including, for example, forming a coating film of a composition for forming an optically anisotropic film containing a polymerizable liquid crystal compound and at least two dichroic dyes on a substrate with or without an oriented film interposed therebetween; drying the obtained coating film to obtain a dried coating film; and curing the coating film in a state in which the polymerizable liquid crystal compound and the dichroic dye in the coating film are oriented in a vertical direction with respect to the coating film plane.

Examples of the substrate include a glass substrate and a film substrate, and a resin film substrate is preferable from the viewpoint of processability. Examples of the resin constituting the film substrate include polyolefins such as polyethylene, polypropylene, and a norbornene-based polymer; a cyclic olefin-based resin; a polyvinyl alcohol; polyethylene terephthalate; polymethacrylic acid ester; polyacrylic acid ester; cellulose esters such as triacetyl cellulose, diacetyl cellulose, and cellulose acetate propionate; polyethylene naphthalate; polycarbonate; polysulfone; polyethersulfone; polyether ketone; and plastics such as polyphenylene sulfide and polyphenylene oxide. Such a resin can be formed into a film by a known means such as a solvent casting method or a melt extrusion method to form a substrate. The substrate surface may have a protective layer formed of an acrylic resin, a methacrylic resin, an epoxy resin, an oxetane resin, a urethane resin, a melamine resin, or the like, and may be subjected to a surface treatment such as a release treatment such as a silicone treatment, a corona treatment, or a plasma treatment.

A commercially available product may be used as the substrate. Examples of commercially available cellulose ester substrates include cellulose ester substrates available from Fuji Photographic Film Co., Ltd., such as Fujitac Film Co., Ltd.; and cellulose ester substrates such as "KC8UX2M", "KC8UY", and "KC4UY" available from Konica Minolta, Inc. Examples of the commercially available cyclic olefin-based resin include a cyclic olefin-based resin such as "Topas (registered trademark)" available from Ticona (Germany); a cyclic olefin-based resin available from JSR Corporation, such as "ARTON (registered trademark)"; cyclic olefin-based resins available from Zeon Corporation, such as "ZEONOR (ZEONOR) (registered trademark)" and "ZEONEX (ZEONEX) (registered trademark)"; and a cyclic olefin-based resin such as "APEL (registered trademark)" available from Mitsui Chemicals, Inc. A commercially available cyclic olefin-based resin substrate can also be used. Examples of commercially available cyclic olefin-based resin substrates include cyclic olefin-based resin substrates such as "Escena (registered trademark)" and "SCA 40 (registered trademark)" available from Sekisui Chemical Co., Ltd.; a cyclic olefin-based resin substrate such as "ZEONOR film (registered trademark)" available from Optes Inc.; and a cyclic olefin-based resin substrate available from JSR Corporation, such as "Arton Film (registered trademark)".

The thickness of the substrate is not particularly limited, and is usually 5 to 300 µm and may be 10 to 150 µm.

In the present invention, the optically anisotropic film may be formed on the oriented film. The oriented film has an orientation control force for allowing the polymerizable liquid crystal compound to be orientated in a desired direction, and by applying the composition for forming an optically anisotropic film on the oriented film, an optically anisotropic film that is accurately oriented is easily obtained. As the oriented film, a film having solvent resistance in which the film is not dissolved by coating or the like of a composition for an optically anisotropic film, and having heat resistance in a heat treatment for removing the solvent and orienting the polymerizable liquid crystal compound is preferable. Examples of the oriented film include an oriented film containing a compound (hereinafter, referred to as "vertical orientation promoting compound") capable of promoting the orientation of the polymerizable liquid crystal compound in a direction perpendicular to the film plane, and an oriented film containing an orienting polymer.

The oriented film containing the vertical orientation promoting compound is usually obtained by applying a composition (hereinafter, also referred to as "composition containing a vertical orientation promoting compound") in which the vertical orientation promoting compound is dissolved in a solvent to a substrate and removing the solvent. Examples of the solvent include water, an alcohol solvent, a mixed solvent of water and alcohol, and the same solvents as those exemplified above as the solvent that can be used for the composition for forming an optically anisotropic film.

Examples of the vertical orientation promoting compound include nonionic silane compounds of a silicon polymer such as polysilane, a silicone resin such as a silicone oil and a silicone resin, a silicone oligomer, an organic-inorganic silane compound (more specifically, a silane coupling agent and the like) such as silsessiloxane and alkoxysilane, and a silane coupling agent is preferable.

The concentration of the vertical orientation promoting compound in the composition containing a vertical orientation promoting compound may be in a range in which the vertical orientation promoting compound can be completely dissolved in a solvent, and is preferably 0.1 to 20% and more preferably about 0.1 to 10% in terms of solid content with respect to the solution.

The oriented film containing an orienting polymer is usually obtained by applying a composition obtained by dissolving an orienting polymer in a solvent (hereinafter, also referred to as "orienting polymer composition") to a substrate and removing the solvent, or applying an orienting polymer composition to a substrate, removing the solvent, and rubbing the substrate (rubbing method). Examples of the solvent include the same solvents as those exemplified above as the solvent that can be used for the composition for forming an optically anisotropic film.

Examples of the orienting polymer include polyamides and gelatins having an amide bond in the molecule, polyimides having an imide bond in the molecule and polyamic acids which are hydrolysates thereof, polyvinyl alcohol, alkyl-modified polyvinyl alcohol, polyacrylamide, polyoxazole, polyethyleneimine, polystyrene, polyvinylpyrrolidone, polyacrylic acid, and polyacrylic acid esters. Among them, polyvinyl alcohol is preferable. The orienting polymer can be used singly or in combination of two or more kinds thereof.

The concentration of the orienting polymer in the orienting polymer composition may be within a range in which the orienting polymer material can be completely dissolved in the solvent, and is preferably 0.1 to 20% and more preferably about 0.1 to 10% in terms of solid content with respect to the solution.

As the orienting polymer composition, a commercially available oriented film material may be used as it is. Examples of the commercially available oriented film material include SUNEVER (Registered trademark, available from Nissan Chemical Industries, Ltd.) and OPTMER (Registered trademark, available from JSR Corporation).

Examples of the method for applying the orienting polymer composition to the substrate include known methods such as coating methods such as a spin coating method, an extrusion method, a gravure coating method, a die coating method, a bar coating method, and an applicator method, and printing methods such as a flexographic method.

Examples of the method for removing the solvent contained in the orienting polymer composition include a natural drying method, a forced-air drying method, a heat drying method, and a reduced-pressure drying method.

In order to apply an orientation control force to the oriented film, a rubbing treatment can be performed as necessary (rubbing method). Examples of the method for applying the orientation control force by the rubbing method include a method in which a film of an orienting polymer formed on the surface of a substrate is brought into contact with a rotating rubbing roll around which a rubbing cloth is wound by applying an orienting polymer composition to the substrate and annealing the composition. When masking is performed during the rubbing treatment, a plurality of regions (patterns) having different orientations can be formed in the oriented film.

Examples of the method for applying the composition for forming an optically anisotropic film to the substrate or the like include the same methods as those exemplified as the method for applying the orienting polymer composition to the substrate.

When the composition for forming an optically anisotropic film contains a solvent, the solvent is usually removed from the applied composition. Examples of the method for removing the solvent include a natural drying method, a forced-air drying method, a heat drying method, and a reduced-pressure drying method. The dried coating film is preferably dried so that a residual solvent in the optically anisotropic film is 1% by weight or less with respect to the total mass of the optically anisotropic film. The conditions such as the drying temperature and the drying time can be appropriately determined according to the composition of the composition for forming an optically anisotropic film, the material of the film substrate, and the like.

The polymerizable liquid crystal compound in the coating film is usually heated to a temperature equal to or higher than a temperature at which the compound is transitioned to a liquid crystal state or a solution state, and then cooled to a temperature at which liquid crystal orientation is performed, thereby being oriented together with the dichroic dye to form a liquid crystal phase.

The temperature at which the polymerizable liquid crystal compound in the coating film is oriented may be determined in advance by texture observation or the like using a composition containing the polymerizable liquid crystal compound. The removal of the solvent and the liquid crystal orientation may be performed simultaneously. The temperature at this time depends on the solvent to be removed and the kind of the polymerizable liquid crystal compound to be used, and is preferably in the range of 50 to 200° C., and more preferably in the range of 80 to 130° C.

By polymerizing and curing the polymerizable liquid crystal compound while maintaining the liquid crystal state of the polymerizable liquid crystal compound, an optically anisotropic film is formed as a cured film of the polymerizable liquid crystal composition. The polymerization method is preferably a photopolymerization method. In photopolymerization, the light (active energy ray) applied to the dried coating film is appropriately selected according to the kind (particularly, the kind of the polymerizable group of the polymerizable liquid crystal compound) of the polymerizable liquid crystal compound contained in the dried coating film, the kind and amount of the polymerization initiator, and the like. A liquid crystal cured film containing a polymerizable liquid crystal compound polymerized while holding a liquid crystal phase of a (higher order) smectic phase has higher polarizing performance than the liquid crystal cured film in the related art obtained by polymerizing a polymerizable liquid crystal compound or the like while holding a liquid crystal phase of a nematic phase, and has higher polarizing performance and film strength than those obtained by applying only a dichroic dye or lyotropic liquid crystal.

Examples of the light source of the active energy ray include a low pressure mercury lamp, a medium pressure mercury lamp, a high pressure mercury lamp, an ultra-high pressure mercury lamp, a xenon lamp, a halogen lamp, a carbon arc lamp, a tungsten lamp, a gallium lamp, an excimer laser, an LED light source that emits light in a wavelength range of 380 to 440 nm, a chemical lamp, a black light lamp, a microwave excitation mercury lamp, and a metal halide lamp. The light source is preferably a light source having a light emission distribution at a wavelength of 400 nm or less, such as a low pressure mercury lamp, a medium pressure mercury lamp, a high pressure mercury lamp, an ultra-high pressure mercury lamp, a chemical lamp, a black light lamp, a microwave excited mercury lamp, or a metal halide lamp, and more preferably an ultraviolet ray parallel to a normal direction of a substrate.

The irradiation energy of the active energy ray is preferably set so that the irradiation intensity in the wavelength region effective for activating the polymerization initiator is 10 to 5000 mJ/cm$^2$ and more preferably 100 to 2000 mJ/cm$^2$.

<Laminate>

The laminate of the present invention includes the optically anisotropic film of the present invention, a polarizing film, and a horizontally oriented retardation film. By stacking the optically anisotropic film of the present invention on a laminate including the polarizing film and the horizontally oriented retardation film and functioning as a circularly polarizing plate, the hue difference between a front hue and an oblique hue can be effectively reduced during the white display, and excellent image display characteristics can be exhibited when the optically anisotropic film is incorporated into an organic EL display device or the like.

The polarizing film constituting the laminate of the present invention is a film having a function of extracting linearly polarized light from incident natural light. Examples of the polarizing film include a stretched film on which a dye having absorption anisotropy is adsorbed, and a film containing a film coated with a dye having absorption anisotropy as a polarizer. Examples of the dye having absorption anisotropy include dichroic dyes.

A film containing the stretched film, as a polarizer, on which a dye having absorption anisotropy is adsorbed is usually produced by uniaxially stretching a polyvinyl alcohol-based resin film, dyeing the polyvinyl alcohol-based resin film with a dichroic dye to adsorb the dichroic dye, treating the polyvinyl alcohol-based resin film to which the dichroic dye is adsorbed with an aqueous boric acid solution, and washing the polyvinyl alcohol-based resin film with water after treatment with an aqueous boric acid solution.

The polyvinyl alcohol-based resin is obtained by saponifying a polyvinyl acetate-based resin. Examples of the polyvinyl acetate-based resin include, in addition to polyvinyl acetate which is a homopolymer of vinyl acetate, a copolymer with another monomer copolymerizable with vinyl acetate. Examples of other monomers copolymerizable with vinyl acetate include unsaturated carboxylic acids, olefins, vinyl ethers, unsaturated sulfonic acids, and acrylamides having an ammonium group.

A saponification degree of the polyvinyl alcohol-based resin is usually about 85 to 100 mol %, and preferably 98 mol % or more. The polyvinyl alcohol-based resin may be modified, and for example, polyvinyl formal or polyvinyl acetal modified with an aldehyde can also be used. The average polymerization degree of the polyvinyl alcohol-based resin is usually about 1,000 to 10,000, and preferably in the range of 1,500 to 5,000.

A film obtained by forming such a polyvinyl alcohol-based resin is used as a raw film of a polarizing film. The method for forming a polyvinyl alcohol-based resin is not particularly limited, and a film can be formed by a known method. The film thickness of the polyvinyl alcohol-based raw film can be, for example, about 10 to 150 μm.

The polyvinyl alcohol-based resin film can be uniaxially stretched before, simultaneously with, or after dyeing with a dichroic dye. When the uniaxial stretching is performed after dyeing, the uniaxial stretching may be performed before or during the boric acid treatment. It is also possible to perform uniaxial stretching in a plurality of these stages. In the uniaxial stretching, uniaxial stretching may be performed between rolls having different circumferential speeds, or uniaxial stretching may be performed using heat rolls. The uniaxial stretching may be dry stretching in which stretching is performed in the air, or may be wet stretching in which stretching is performed in a state where a polyvinyl alcohol-based resin film is swollen using a solvent. A stretch ratio is usually about 3 to 8 times.

The polyvinyl alcohol-based resin film is dyed with a dichroic dye by, for example, a method for immersing the polyvinyl alcohol-based resin film in an aqueous solution containing a dichroic dye.

Specifically, iodine and a dichroic organic dye are used as the dichroic dye. Examples of the dichroic organic dye include a dichroic direct dye formed of a disazo compound such as C.I. DIRECT RED 39, and a dichroic direct dye formed of a compound such as trisazo or tetrakisazo. The polyvinyl alcohol-based resin film is preferably subjected to an immersion treatment in water before a dyeing treatment.

When iodine is used as the dichroic dye, a method for immersing a polyvinyl alcohol-based resin film in an aqueous solution containing iodine and potassium iodide to dye the film is usually employed.

The content of iodine in this aqueous solution is usually about 0.01 to 1 parts by mass per 100 parts by mass of water. The content of potassium iodide is usually about 0.5 to 20 parts by mass per 100 parts by mass of water. The temperature of the aqueous solution used for dyeing is usually about 20 to 40° C. The immersion time (dyeing time) in the aqueous solution is usually about 20 to 1,800 seconds.

On the other hand, when the dichroic organic dye is used as the dichroic dye, a method for immersing a polyvinyl alcohol-based resin film in an aqueous solution containing a water-soluble dichroic dye and dyeing is employed.

The content of the dichroic organic dye in this aqueous solution is usually about $1\times10^{-4}$ to 10 parts by mass, preferably $1\times10^{-3}$ to 1 part by mass, and more preferably $1\times10^{-3}$ to $1\times10^{-2}$ parts by mass, based on 100 parts by mass of water. The aqueous solution may contain an inorganic salt such as sodium sulfate as a dyeing assistant. The temperature of a dichroic dye aqueous solution used for dyeing is usually about 20 to 80° C. The immersion time (dyeing time) in the aqueous solution is usually about 10 to 1,800 seconds.

The boric acid treatment after dyeing with a dichroic dye can be usually performed by a method for immersing the dyed polyvinyl alcohol-based resin film in an aqueous boric acid solution. The content of boric acid in the aqueous boric acid solution is usually about 2 to 15 parts by mass, and preferably 5 to 12 parts by mass, per 100 parts by mass of water. When iodine is used as the dichroic dye, the aqueous boric acid solution preferably contains potassium iodide, and the content of potassium iodide in this case is usually about 0.1 to 15 parts by mass, and preferably 5 to 12 parts by mass, per 100 parts by mass of water. The immersion time in the aqueous boric acid solution is usually about 60 to 1,200 seconds, preferably 150 to 600 seconds, and more preferably 200 to 400 seconds. The temperature of the boric acid treatment is usually 50° C. or higher, preferably 50 to 85° C., and more preferably 60 to 80° C.

The polyvinyl alcohol-based resin film after the boric acid treatment is usually washed with water. The water washing treatment can be performed, for example, by a method for immersing the boric acid-treated polyvinyl alcohol-based resin film in water. The temperature of water in the water washing treatment is usually about 5 to 40° C.

The immersion time is usually about 1 to 120 seconds.

After washing with water, a drying treatment is performed to obtain a polarizing film (polarizer). The drying treatment can be performed using, for example, a hot air dryer or a far infrared heater. The temperature of the drying treatment is usually about 30 to 100° C., and preferably 50 to 80° C. The drying treatment time is usually about 60 to 600 seconds, and preferably 120 to 600 seconds. By the drying treatment, the moisture content of the polarizing film is reduced to a practical level. The moisture content is usually about 5 to 20% by mass, and preferably 8 to 15% by mass. When the moisture content is within the above range, a polarizing film having moderate flexibility and excellent thermal stability can be obtained.

The thickness of the polarizing film obtained by subjecting the polyvinyl alcohol-based resin film to uniaxial stretching, dyeing with a dichroic dye, a boric acid treatment, water washing, and drying is preferably 5 to 40 μm.

Examples of the film coated with a dye having absorption anisotropy include a film obtained by coating a composition containing a dichroic dye having liquid crystallinity or a composition containing a dichroic dye and a polymerizable liquid crystal.

A film coated with a dye having absorption anisotropy is preferably thin, but when the film is excessively thin, the strength decreases, and processability tends to be poor. The thickness of the film is usually 20 μm or less, preferably 5 μm or less, and more preferably 0.5 to 3 μm.

Specific examples of the film coated with the dye having absorption anisotropy include the film disclosed in JP-A-2012-33249 and the like.

A transparent protective layer may be stacked on one surface or both surfaces of the polarizing film thus obtained, for example, with an adhesive layer interposed therebetween. The transparent protective layer can contribute to prevention of shrinkage and expansion of the polarizing film, prevention of deterioration of the polarizing film due to temperature, humidity, ultraviolet rays, and the like, prevention of scratches on the polarizing film, and the like. As the protective film, a transparent film similar to the resin film exemplified above can be used as a substrate that can be used for producing the optically anisotropic film.

The laminate of the present invention includes a horizontally oriented retardation film. The horizontally oriented retardation film that can constitute the laminate of the present invention means a retardation film oriented in the horizontal direction with respect to an in-plane direction of the film, and may be, for example, a stretched film or a cured product of a polymerizable liquid crystal composition (hereinafter, also referred to as "composition for forming a horizontally oriented liquid crystal cured film") containing a polymerizable liquid crystal compound, which is a cured product (hereinafter, also referred to as "horizontally oriented liquid crystal cured film") obtained by curing the polymerizable liquid crystal compound in a state of being oriented in the horizontal direction with respect to the plane of the retardation film.

In the present invention, the horizontally oriented retardation film preferably satisfies the following Formulae (15) and (16).

$$ReA(450)/ReA(550) \leq 1.0 \quad (15)$$

$$1.0 \leq ReA(650)/ReA(550) \quad (16)$$

[in Formulae (15) and (16), ReA(X) represents an in-plane retardation value of the horizontally oriented retardation film at a wavelength of λ nm, and $ReA(\lambda)=(nxA(\lambda)-nyA(\lambda)) \times dA$ (wherein nxA(λ) represents a main refractive index at a wavelength of λnm in a plane of the horizontally oriented retardation film, nyA(λ) represents a refractive index at a wavelength of λnm in a direction orthogonal to a direction of nxA in the same plane as nxA, and dA represents a film thickness of the horizontally oriented retardation film).]

When the horizontally oriented retardation film satisfies Formulae (15) and (16), the horizontally oriented retardation film exhibits so-called reverse wavelength dispersibility in which an in-plane retardation value at a short wavelength is smaller than an in-plane retardation value at a long wavelength. For example, when such a horizontally oriented retardation film is combined with the optically anisotropic film of the present invention, it is possible to exhibit an excellent effect of improving the front reflection hue during black display in addition to improving the front hue and the oblique hue during white display when the film is incorporated in the organic EL display device. Since the reverse wavelength dispersibility is improved and the effect of improving the reflection hue in the front direction of the horizontally oriented retardation film can be further enhanced, ReA(450)/ReA(550) is preferably 0.70 or more and more preferably 0.78 or more, and is preferably 0.92 or less, more preferably 0.90 or less, still more preferably 0.87 or less, particularly preferably 0.86 or less and, more particularly preferably 0.85 or less. In addition, ReA(650)/ReA(550) is preferably 1.01 or more, and more preferably 1.02 or more.

Hereinafter, the effect related to the improvement (change) of the "front reflection hue during the black display" means an improvement effect (that is, the effect of reducing light leakage when viewed from a front direction during the black display) in the front reflection hue during the black display when the optically anisotropic film is applied to a display device in combination with a horizontally oriented retardation film.

The in-plane retardation value can be adjusted by the thickness dA of the horizontally oriented retardation film. Since the in-plane retardation value is determined by the above formula $ReA(\lambda)=(nxA(\lambda)-nyA(\lambda)) \times dA$, a three-dimensional refractive index and a film thickness dA may be adjusted in order to obtain a desired in-plane retardation value (ReA(λ): the in-plane retardation value of the horizontally oriented retardation film at the wavelength λ(nm)).

The horizontally oriented retardation film preferably satisfies the following Formula (17).

$$120 \text{ nm} \leq ReA(550) \leq 170 \text{ nm} \quad (17)$$

[in Formula (17), ReA(λ) has the same meaning as described above.]

When the in-plane retardation ReA(550) of the horizontally oriented retardation film is within the range of Formula (17), the effect of improving the front reflection hue during the black display (the effect of suppressing coloring) when the laminate (elliptically polarizing plate) containing the horizontally oriented retardation film is applied to an organic EL display device becomes remarkable. A more preferable range of the in-plane retardation value is 130 nm 5 ReA(550) S 150 nm.

The horizontally oriented retardation film is preferably a horizontally oriented liquid crystal cured film because the desired retardation of the retardation film can be easily controlled and can be thinned. As the polymerizable liquid crystal compound for forming the horizontally oriented liquid crystal cured film, a polymerizable liquid crystal compound known in the field of retardation films can be used.

The polymerizable liquid crystal compound that forms the horizontally oriented liquid crystal cured film is a liquid crystal compound having at least one polymerizable group. Examples of the polymerizable liquid crystal compound generally include a polymerizable liquid crystal compound in which a polymer (cured product) obtained by polymerizing the polymerizable liquid crystal compound alone in a state of being oriented in a specific direction exhibits positive wavelength dispersibility and a polymerizable liquid crystal compound exhibiting reverse wavelength dispersibility. In the present invention, only one kind of polymerizable liquid crystal compound may be used, or both kinds of polymerizable liquid crystal compounds may be mixed and used. From the viewpoint of easily improving the optical characteristics as a laminate, the horizontally oriented retardation film in the laminate of the present invention is preferably a cured film of a polymerizable liquid crystal composition containing a polymerizable liquid crystal compound exhibiting so-called reverse wavelength dispersibility.

In the present invention, the polymerizable group contained in the polymerizable liquid crystal compound that forms the horizontally oriented liquid crystal cured film is preferably a photopolymerizable group. Examples of the photopolymerizable group include the same polymerizable groups as those of the polymerizable liquid crystal compound (A) that forms the optically anisotropic film. Among them, a (meth)acryloyl group, a vinyloxy group, an oxylanyl group, and an oxetanyl group are preferable, and an acryloyl group is more preferable.

The liquid crystallinity exhibited by the polymerizable liquid crystal compound that forms the horizontally oriented liquid crystal cured film may be a thermotropic liquid crystal or a lyotropic liquid crystal, but a thermotropic liquid crystal is preferable from the viewpoint of enabling dense film thickness control. The phase order structure in the thermotropic liquid crystal may be nematic liquid crystal, smectic liquid crystal, or discotic liquid crystal. The polymerizable liquid crystal compounds that form the horizontally oriented liquid crystal cured film can be used alone or in combination of two or more thereof.

A polymerizable liquid crystal compound having a so-called T-shaped or H-shaped molecular structure tends to exhibit the reverse wavelength dispersibility when polymerized and cured, and a polymerizable liquid crystal compound having a T-shaped molecular structure tends to exhibit stronger reverse wavelength dispersibility.

The polymerizable liquid crystal compound exhibiting the reverse wavelength dispersibility is preferably a compound having the following characteristics (A) to (D).

(A) A compound capable of forming a nematic phase or a smectic phase.

(B) A $\pi$ electron is present on a major axis direction (a) of the polymerizable liquid crystal compound.

(C) A $\pi$ electron is present on a direction [intersecting direction (b)] intersecting the major axis direction (a).

(D) A $\pi$ electron density in the major axis direction (a) of the polymerizable liquid crystal compound defined by the following Formula (i), in which a total of the n electrons present in the major axis direction (a) is set as $N(\pi a)$ and a total of the molecular weight present in the major axis direction is set as $N(Aa)$:

$$D(\pi a)=N(\pi a)/N(Aa) \qquad (i)$$

and a $\pi$ electron density in the intersecting direction (b) of the polymerizable liquid crystal compound defined by the following Formula (ii), in which a total of the $\pi$ electrons present in the intersecting direction (b) is set as $N(\pi b)$ and a total of the molecular weight present in the intersecting direction (b) is set as $N(Ab)$:

$$D(\pi b)=N(\pi b)/N(Ab) \qquad (ii)$$

are in a relationship of Formula (iii)

$$0 \leq [D(\pi a)/D(\pi b)]<1 \qquad (iii)$$

[that is, the $\pi$ electron density in the intersecting direction (b) is larger than the $\pi$ electron density in the major axis direction (a).]. As described above, a polymerizable liquid crystal compound having $\pi$ electrons on the long axis and the intersecting direction thereof generally tends to have a T-shape structure.

In the above features (A) to (D), the major axis direction (a) and the $\pi$ electron number N are defined as follows.

The major axis direction (a) is, for example, a major axis direction of a rod when the compound has a rod-like structure.

The number of r electrons $N(\pi a)$ present in the major axis direction (a) does not include $\pi$ electrons that disappear due to the polymerization reaction.

The number of $\pi$ electrons $N(\pi a)$ present on the major axis direction (a) is the total number of $\pi$ electrons on the major axis and $\pi$ electrons conjugated with the $\pi$ electrons, and includes, for example, the number of $\pi$ electrons present in a ring present on the major axis direction (a) and satisfying the Hückel rule.

The number of $\pi$ electrons $N(\pi b)$ present in the intersecting direction (b) does not include $\pi$ electrons that disappear due to the polymerization reaction.

The polymerizable liquid crystal compound satisfying the above condition has a mesogen structure in the major axis direction. This mesogenic structure develops a liquid crystal phase (nematic phase, smectic phase).

It is possible to form a nematic phase or a smectic phase by heating the polymerizable liquid crystal compound satisfying the above (A) to (D) to a phase transition temperature or higher. In the nematic phase or the smectic phase formed by orienting the polymerizable liquid crystal compound, the major axis directions of the polymerizable liquid crystal compound are usually oriented so as to be parallel to each other, and the major axis direction is the orientation direction of the nematic phase or the smectic phase. When such a polymerizable liquid crystal compound is formed into a film and polymerized in a state of a nematic phase or a smectic phase, a polymer film formed of a polymer polymerized in a state of being oriented in the major axis direction (a) can be formed. This polymer film absorbs ultraviolet rays by $\pi$ electrons on the major axis direction (a) and $\pi$ electrons on the intersecting direction (b). Here, the absorption maximum wavelength of ultraviolet light absorbed by $\pi$ electrons in the intersecting direction (b) is set as λb max. λb max is usually 300 nm to 400 nm. Since the density of π electrons satisfies the above Formula (iii) and the π electron density in the intersecting direction (b) is larger than the π electron density in the major axis direction (a), the polymer film has a larger absorption of linearly polarized ultraviolet light (wavelength λb max) having an oscillation surface in the intersecting direction (b) than absorption of linearly polarized ultraviolet light (wavelength λb max) having an oscillation surface in the major axis direction (a). The ratio (ratio of absorbance in intersecting direction (b) to absorbance in major axis direction (a) of linearly polarized ultraviolet rays) is, for example, more than 1.0, preferably 1.2 or more and usually 30 or less, and is, for example, 10 or less.

In general, when a polymerizable liquid crystal compound having the above characteristics is polymerized in a state of being oriented in one direction, the birefringence index of the polymer often exhibits the reverse wavelength dispersibility. Specific examples thereof include a compound represented by the following Formula (X) (hereinafter, also referred to as P-31CI "polymerizable liquid crystal compound (X)").

[Chem. 13]

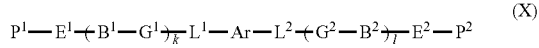

(X)

In Formula (X), Ar represents a divalent group having an aromatic group which may have a substituent. Examples of the aromatic group as used herein include groups exemplified by (Ar-1) to (Ar-23) described later. Ar may have two or more aromatic groups. The aromatic group may contain at least one of a nitrogen atom, an oxygen atom, and a sulfur atom. When Ar contains two or more aromatic groups, the two or more aromatic groups may be bonded to each other by a single bond or a divalent bonding group such as —CO—O— or —O—.

In Formula (X), $G^1$ and $G^2$ each independently represent a divalent aromatic group or a divalent alicyclic hydrocarbon group. Here, the hydrogen atom contained in the divalent aromatic group or divalent alicyclic hydrocarbon group may be substituted with a halogen atom, an alkyl group having 1 to 4 carbon atoms, a fluoroalkyl group having 1 to 4 carbon atoms, an alkoxy group having 1 to 4 carbon atoms, a cyano group, or a nitro group, and the carbon atom constituting the divalent aromatic group or divalent alicyclic hydrocarbon group may be substituted with an oxygen atom, a sulfur atom, or a nitrogen atom.

In Formula (X), $L^1$, $L^2$, $B^1$, and $B^2$ are each independently a single bond or a divalent linking group.

In Formula (X), k and l each independently represent an integer of 0 to 3, and satisfy a relationship of 1≤k+l. Here, when 2≤k+l, $B^1$ and $B^2$, and $G^1$ and $G^2$ may be the same as or different from each other.

In Formula (X), $E^1$ and $E^2$ each independently represent an alkanediyl group having 1 to 17 carbon atoms, and an alkanediyl group having 4 to 12 carbon atoms is more preferable. The hydrogen atom contained in the alkanediyl group may be substituted with a halogen atom, and —CH₂— contained in the alkanediyl group may be substituted with —O—, —S—, and —C(=O)—.

In Formula (X), $P^1$ and $P^2$ each independently represent a polymerizable group or a hydrogen atom, and at least one of $P^1$ and $P^2$ is a polymerizable group.

$G^1$ and $G^2$ are each independently preferably a 1,4-phenylenediyl group optionally substituted with at least one substituent selected from the group consisting of a halogen atom and an alkyl group having 1 to 4 carbon atoms, a 1,4-cyclohexanediyl group optionally substituted with at least one substituent selected from the group consisting of a halogen atom and an alkyl group having 1 to 4 carbon atoms, more preferably a 1,4-phenylenediyl group substituted with a methyl group, an unsubstituted 1,4-phenylenediyl group, or an unsubstituted 1,4-trans-cyclohexanediyl group, and particularly preferably an unsubstituted 1,4-phenylenediyl group or an unsubstituted 1,4-trans-cyclohexanediyl group.

In addition, at least one of the plurality of $G^1$ and $G^2$ is preferably a divalent alicyclic hydrocarbon group, and at least one of $G^1$ and $G^2$ bonded to $L^1$ or $L^2$ is more preferably a divalent alicyclic hydrocarbon group.

$L^1$ and $L^2$ are each independently preferably a single bond, an alkylene group having 1 to 4 carbon atoms, —O—, —S—, —$R^{a1}$O$R^{a2}$—, —$R^{a3}$COO$R^{a4}$—, —$R^{a5}$OCO$R^{a6}$—, —$R^{a7}$OC=OO$R^{a8}$—, —N=N—, —$CR^c$=$CR^d$—, or —C≡C—. Here, $R^{a1}$ to $R^{a8}$ each independently represent a single bond or an alkylene group having 1 to 4 carbon atoms, and $R^c$ and $R^d$ each represent an alkyl group having 1 to 4 carbon atoms or a hydrogen atom. $L^1$ and $L^2$ are each independently more preferably a single bond, —O$R^{a2-1}$—, —CH₂—, —CH₂CH₂—, —COO$R^{a4-1}$—, or —OCO$R^{a6-1}$—. Here, $R^{a2-1}$, $R^{a4-1}$, and $R^{6-1}$ each independently represent a single bond, —CH₂—, or —CH₂CH₂—. $L^1$ and $L^2$ are each independently more preferably a single bond, —O—, —CH₂CH₂—, —COO—, —COOCH₂CH₂—, or —OCO—.

$B^1$ and $B^2$ are each independently preferably a single bond, an alkylene group having 1 to 4 carbon atoms, —O—, —S—, —$R^{a9}$O$R^{a10}$—, —$R^{a11}$COOO$R^{a12}$—, —$R^{a13}$OCO$R^{a14}$—, or —$R^{a15}$OC=OO$R^{a16}$—. Here, $R^{a9}$ to $R^{a16}$ each independently represent a single bond or an alkylene group having 1 to 4 carbon atoms. $B^1$ and $B^2$ are each independently more preferably a single bond, —O$R^{a1-1}$—, —CH₂—, —CH₂CH₂—, —COO$R^{a12-1}$—, or —OCO$R^{a14-1}$—. Here, $R^{a1-1}$, $R^{a12-1}$, $R^{a14-1}$ each independently represent any one of a single bond, —CH₂—, and —CH₂CH₂—. $B^1$ and $B^2$ are each independently more preferably a single bond, —O—, —CH₂CH₂—, —COO—, —COOCH₂CH₂—, —OCO—, or —OCOCH₂CH₂—.

From the viewpoint of expression of reverse wavelength dispersibility, k and l are preferably in the range of 2≤k+l≤6, preferably k+l=4, and more preferably k=2 and l=2. When k=2 and l=2 are satisfied, a symmetric structure is obtained, which is preferable.

Examples of the polymerizable group represented by $P^1$ or $P^2$ include an epoxy group, a vinyl group, a vinyloxy group, a 1-chlorovinyl group, an isopropenyl group, a 4-vinylphenyl group, a (meth)acryloyl group, an oxylanyl group, and an oxetanyl group. Among them, a (meth)acryloyl group, a vinyl group, and a vinyloxy group are preferable, and a (meth)acryloyl group is more preferable.

Ar preferably has at least one selected from an aromatic hydrocarbon ring which may have a substituent, an aromatic heterocyclic ring which may have a substituent, and an electron-attracting group. Examples of the aromatic hydrocarbon ring include a benzene ring, a naphthalene ring, and an anthracene ring, and a benzene ring and a naphthalene ring are preferable. Examples of the aromatic heterocyclic ring include a furan ring, a benzofuran ring, a pyrrole ring, an indole ring, a thiophene ring, a benzothiophene ring, a pyridine ring, a pyrazine ring, a pyrimidine ring, a triazole ring, a triazine ring, a pyrroline ring, an imidazole ring, a pyrazole ring, a thiazole ring, a benzothiazole ring, a thienothiazole ring, an oxazole ring, a benzoxazole ring, and a phenanthroline ring. Among them, it is preferable to have a thiazole ring, a benzothiazole ring, or a benzofuran ring, and it is more preferable to have a benzothiazole ring. When Ar contains a nitrogen atom, the nitrogen atom preferably has a π electron.

In Formula (X), the total number Nπ of π electrons of the group represented by Ar is usually 6 or more, preferably 8 or more, more preferably 10 or more, still more preferably 14 or more, and particularly preferably 16 or more. It is preferably 36 or less, more preferably 32 or less, still more preferably 26 or less, and particularly preferably 24 or less.

Examples of the aromatic group contained in Ar include the following groups.

[Chem. 14]

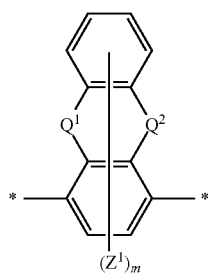
(Ar-1)

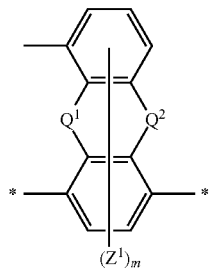
(Ar-2)

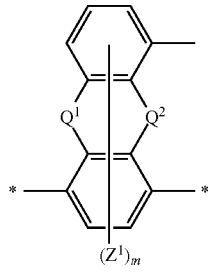
(Ar-3)

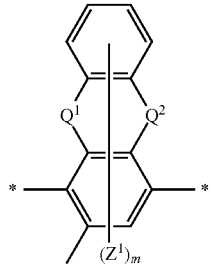
(Ar-4)

-continued

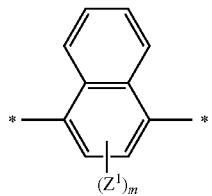
(Ar-5)

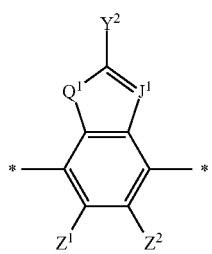
(Ar-6)

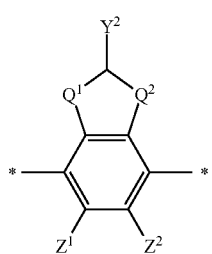
(Ar-7)

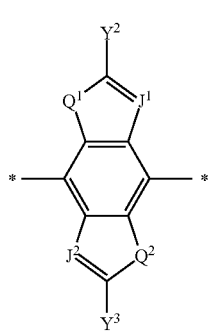
(Ar-8)

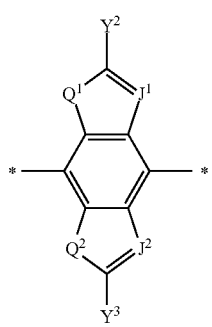
(Ar-9)

(Ar-10)
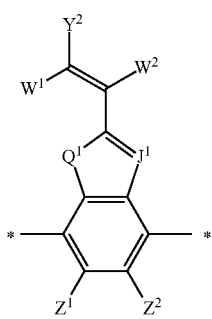
(Ar-11)
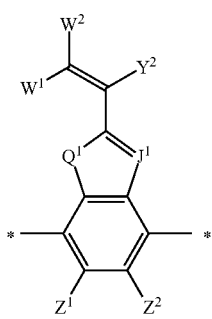
(Ar-12)
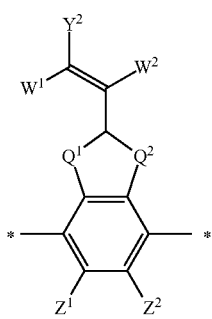
(Ar-13)
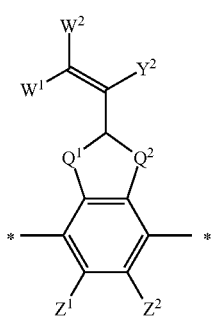
(Ar-14)
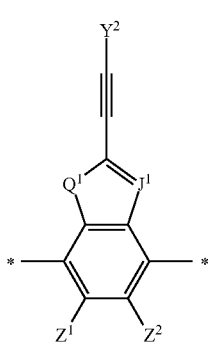
(Ar-15)
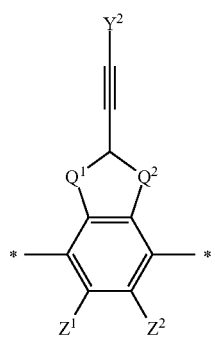
(Ar-16)
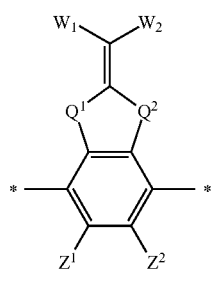
(Ar-17)
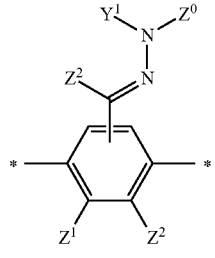
(Ar-18)
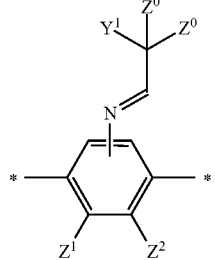
(Ar-19)
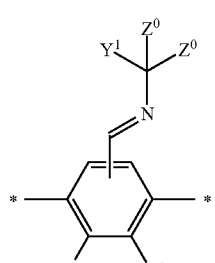

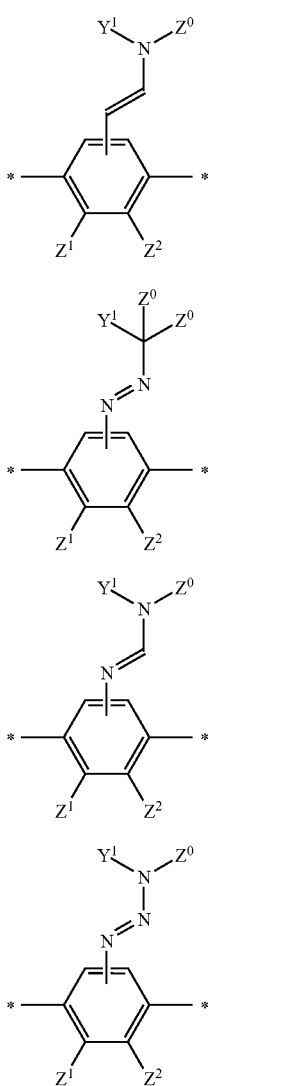

In Formulae (Ar-1) to (Ar-23), the symbol * represents a linking moiety, and $Z^0$, $Z^1$, and $Z^2$ each independently represent a hydrogen atom, a halogen atom, an alkyl group having 1 to 12 carbon atoms, a cyano group, a nitro group, an alkylsulfinyl group having 1 to 12 carbon atoms, an alkylsulfonyl group having 1 to 12 carbon atoms, a carboxyl group, a fluoroalkyl group having 1 to 12 carbon atoms, an alkoxy group having 1 to 12 carbon atoms, an alkylthio group having 1 to 12 carbon atoms, an N-alkylamino group having 1 to 12 carbon atoms, an N,N-dialkylamino group having 2 to 12 carbon atoms, an N-alkylsulfamoyl group having 1 to 12 carbon atoms, or an N,N-dialkylsulfamoyl group having 2 to 12 carbon atoms. $Z^0$, $Z^1$, and $Z^2$ may contain a polymerizable group.

In Formulae (Ar-1) to (Ar-23), $Q^1$ and $Q^2$ each independently represent —$CR^{2'}R^{3'}$—, —S—, —NH—, —$NR^{2'}$—, —CO—, or O—, and $R^{2'}$ and $R^{3'}$ each independently represent a hydrogen atom or an alkyl group having 1 to 4 carbon atoms.

Formulae (Ar-1) to (Ar-23), $J^1$ and $J^2$ each independently represent a carbon atom or a nitrogen atom.

In Formulae (Ar-1) to (Ar-23), $Y^1$, $Y^2$, and $Y^3$ each independently represent an optionally substituted aromatic hydrocarbon group or aromatic heterocyclic group.

In Formulae (Ar-1) to (Ar-23), $W^1$ and $W^2$ each independently represent a hydrogen atom, a cyano group, a methyl group, or a halogen atom, and m represents an integer of 0 to 6.

Examples of the aromatic hydrocarbon group in $Y^1$, $Y^2$, and $Y^3$ include aromatic hydrocarbon groups having 6 to 20 carbon atoms such as a phenyl group, a naphthyl group, an anthryl group, a phenanthryl group, and a biphenyl group, and a phenyl group and a naphthyl group are preferable, and a phenyl group is more preferable. Examples of the aromatic heterocyclic group include aromatic heterocyclic groups having 4 to 20 carbon atoms and containing at least one hetero atom such as a nitrogen atom, an oxygen atom, or a sulfur atom, such as a furyl group, a pyrrolyl group, a thienyl group, a pyridinyl group, a thiazolyl group, or a benzothiazolyl group, and a furyl group, a thienyl group, a pyridinyl group, a thiazolyl group, or a benzothiazolyl group is preferable.

$Y^1$, $Y^2$, and $Y^3$ may each independently be an optionally substituted polycyclic aromatic hydrocarbon group or polycyclic aromatic heterocyclic group. The polycyclic aromatic hydrocarbon group refers to a condensed polycyclic aromatic hydrocarbon group or a group derived from an aromatic ring assembly. The polycyclic aromatic heterocyclic group refers to a fused polycyclic aromatic heterocyclic group or a group derived from an aromatic ring assembly.

$Z^0$, $Z^1$, and $Z^2$ each independently represent a hydrogen atom, a halogen atom, an alkyl group having 1 to 12 carbon atoms, a cyano group, a nitro group, or an alkoxy group having 1 to 12 carbon atoms, Zn is more preferably a hydrogen atom, an alkyl group having 1 to 12 carbon atoms, or a cyano group, and $Z^1$ and $Z^2$ are still more preferably a hydrogen atom, a fluorine atom, a chlorine atom, a methyl group, or a cyano group. $Z^0$, $Z^1$, and $Z^2$ may contain a polymerizable group.

$Q^1$ and $Q^2$ are preferably —NH—, —S—, —$NR^{2'}$—, and —O—, and $R^{2'}$ is preferably a hydrogen atom. Among them, —S—, —O—, and —NH— are particularly preferable.

Among Formulae (Ar-1) to (Ar-23), Formulae (Ar-6) and (Ar-7) are preferable from the viewpoint of molecular stability.

In Formulae (Ar-16) to (Ar-23), $Y^1$ may form an aromatic heterocyclic group together with the nitrogen atom to which $Y^1$ is bonded and $Z^0$. Examples of the aromatic heterocyclic group include those described above as the aromatic heterocyclic ring that Ar may have, and examples thereof include a pyrrole ring, an imidazole ring, a pyrroline ring, a pyridine ring, a pyrazine ring, a pyrimidine ring, an indole ring, a quinoline ring, an isoquinoline ring, a purine ring, and a pyrrolidine ring. The aromatic heterocyclic group may have a substituent. In addition, $Y^1$ may be the above-mentioned optionally substituted polycyclic aromatic hydrocarbon group or polycyclic aromatic heterocyclic group together with the nitrogen atom to which $Y^1$ is bonded and $Z^0$. Examples thereof include a benzofuran ring, a benzothiazole ring, and a benzoxazole ring.

The compound represented by Formula (X) can be produced, for example, in accordance with the method described in JP-A-2010-31223.

In the present invention, as the polymerizable liquid crystal compound that forms the horizontally oriented liquid crystal cured film, for example, a compound containing a group represented by the following Formula (Y) (hereinafter, also referred to as "polymerizable liquid crystal compound (Y)") may be used. The polymerizable liquid crystal compound (Y) generally tends to exhibit positive wavelength dispersibility.

P11-B11-E11-B12-A11-B13-     (Y)

[in Formula (Y), p11 represents a polymerizable group.

A11 represents a divalent alicyclic hydrocarbon group or a divalent aromatic hydrocarbon group.

B11 represents —O—, —S—, —CO—O—, —O—CO—, —O—CO—O—, —CO—NR$^{16}$—, —NR$^{16}$—CO—, —CO—, —CS—, or a single bond. R$^{16}$ represents a hydrogen atom or an alkyl group having 1 to 6 carbon atoms.

B12 and B13 each independently represent —C≡C—, —CH=CH—, —CH$_2$—CH$_2$—, —O—, —S—, —C(=O)—, —C(=O)—O—, —O—C(=O)—, —O—C(=O)—O—, —CH=N—, —N=CH—, —N=N—, —C(=O)—NR$^{16}$—, —NR$^{16}$—C(=O)—, —OCH$_2$—, —OCF$_2$—, —CH$_2$O—, —CF$_2$O—, —CH=CH—C(=O)—O—, —O—C(=O)—CH=CH—, H, —C≡N, or a single bond.

E11 represents an alkanediyl group having 1 to 12 carbon atoms, and a hydrogen atom contained in the alkanediyl group may be substituted with an alkoxy group having 1 to 5 carbon atoms, and a hydrogen atom contained in the alkoxy group may be substituted with a halogen atom. In addition, —CH$_2$— constituting the alkanediyl group may be substituted with —O— or —CO—.].

The number of carbon atoms in the aromatic hydrocarbon group and the alicyclic hydrocarbon group of A11 is preferably in the range of 3 to 18, more preferably in the range of 5 to 12, and particularly preferably 5 or 6. The hydrogen atoms contained in the divalent alicyclic hydrocarbon group and the divalent aromatic hydrocarbon group represented by A11 may be substituted with a halogen atom, an alkyl group having 1 to 6 carbon atoms, an alkoxy group having 1 to 6 carbon atoms, a cyano group, or a nitro group, and the hydrogen atoms contained in the alkyl group having 1 to 6 carbon atoms and the alkoxy group having 1 to 6 carbon atoms may be substituted with a fluorine atom. A11 is preferably a cyclohexane-1,4-diyl group or a 1,4-phenylene group.

E11 is preferably a linear alkanediyl group having 1 to 12 carbon atoms. —CH$_2$— constituting the alkanediyl group may be substituted with —O—.

Specific examples thereof include linear alkanediyl groups having 1 to 12 carbon atoms, such as a methylene group, an ethylene group, a propan-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, and a dodecane-1,12-diyl group; —CH$_2$—CH$_2$—O—CH$_2$—CH$_2$—, —CH$_2$—CH$_2$—O—CH$_2$—CH$_2$—O—CH$_2$—CH$_2$—, and —CH$_2$—CH$_2$—O—CH$_2$—CH$_2$—O—CH$_2$—CH$_2$—.

As B11, —O—, —S—, —CO—O—, and —O—CO— are preferable, and among these, —CO—O— is more preferable.

B12 and B13 are each independently preferably —O—, —S—, —C(=O)—, —C(=O)—O—, —O—C(=O)—, —O—C(=O)—O—, and more preferably —O— or —O—C(=O)—O—.

As the polymerizable group represented by P11, a radically polymerizable group or a cationically polymerizable group is preferable from the viewpoint of high polymerization reactivity, particularly photopolymerization reactivity, and the polymerizable group is preferably a group represented by the following Formulae (P-11) to (P-15) from the viewpoint that handling is easy and the production of the liquid crystal compound itself is also easy.

[Chem. 15]

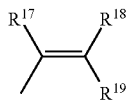 (P-11)

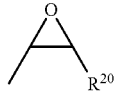 (P-12)

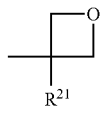 (P-13)

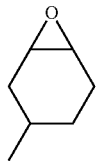 (P-14)

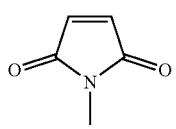 (P-15)

[in Formulae (P-11) to (P-15),

R$^{17}$ to R$^{21}$ each independently represent an alkyl group having 1 to 6 carbon atoms or a hydrogen atom.]

Specific examples of the groups represented by Formulae (P-11) to (P-15) include groups represented by the following Formulae (P-16) to (P-20).

[Chem. 16]

 (P-16)

 (P-17)

 (P-18)

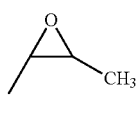 (P-19)

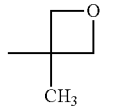 (P-20)

P11 is preferably a group represented by Formula (P-14) to a Formula (P-20), and more preferably a vinyl group, a p-stilbene group, an epoxy group, or an oxetanyl group.

The group represented by P11-B11- is more preferably an acryloyloxy group or a methacryloyloxy group.

Examples of the polymerizable liquid crystal compound (Y) include compounds represented by Formula (I), Formula (II), Formula (III), Formula (IV), Formula (V), or Formula (VI).

P11-B11-E11-B12-A11-B13-A12-B14-A13-B15-A14-B16-E12-B17-P12     (I)

P11-B11-E11-B12-A11-B13-A12-B14-A13-B15-A14-F11     (II)

P11-B11-E11-B12-A11-B13-A12-B14-A13-B15-E12-B17-P12     (III)

P11-B11-E11-B12-A11-B13-A12-B14-A13-F11     (IV)

P11-B11-E11-B12-A11-B13-A12-B14-E12-B17-P12     (V)

P11-B11-E11-B12-A11-B13-A12-F11     (VI)

(in the formula,

A11, B11 to B13, and P11 are the same meaning as in the above Formula (A),

A12 to A14 are each independently synonymous with A11, B14 to B16 are each independently synonymous with B12, B17 is synonymous with B11, E12 is synonymous with E11, and P12 is synonymous with P11.

F11 represents a hydrogen atom, an alkyl group having 1 to 13 carbon atoms, an alkoxy group having 1 to 13 carbon atoms, a cyano group, a nitro group, a trifluoromethyl group, a dimethylamino group, a hydroxy group, a methylol group, a formyl group, a sulfo group (—SO$_3$H), a carboxy group, an alkoxycarbonyl group having 1 to 10 carbon atoms, or a halogen atom, and —CH$_2$— constituting the alkyl group and the alkoxy group may be substituted with —O—.)

Specific examples of the polymerizable liquid crystal compound (Y) include compounds having a polymerizable group among the compounds described in "3.8.6 Network (Completely Crosslinked Type)" and "6.5.1 Liquid crystal material b. Polymerizable nematic liquid crystal material" of Liquid Crystal Handbook (edited by Liquid Crystal Handbook Editorial Committee, published by Maruzen Publishing Co., Ltd., on Oct. 30, 2000), and polymerizable liquid crystals described in JP 2009-173893 A, JP 2010-31223 A, JP 2010-270108 A, JP 2011-6360 A, and JP 2011-207765 A.

The content of the polymerizable liquid crystal compound in the composition for forming a horizontally oriented liquid crystal cured film that forms a horizontally oriented liquid crystal cured film is, for example, 70 to 99.5 parts by mass, preferably 80 to 99 parts by mass, more preferably 85 to 98 parts by mass, and still more preferably 90 to 95 parts by mass, based on 100 parts by mass of the solid content of the composition for forming a horizontally oriented liquid crystal cured film. When the content of the polymerizable liquid crystal compound is within the above range, it is advantageous from the viewpoint of the orientation of the liquid crystal cured film to be obtained. When the composition for forming a horizontally oriented liquid crystal cured film contains two or more kinds of polymerizable liquid crystal compounds, the total content of all polymerizable liquid crystal compounds contained in the composition for forming a horizontally oriented liquid crystal cured film is preferably within the above range.

The composition for forming a horizontally oriented liquid crystal cured film may contain a polymerization initiator for initiating a polymerization reaction of the polymerizable liquid crystal compound. The polymerization initiator can be appropriately selected and used from those used in the related art, and may be a thermal polymerization initiator or a photopolymerization initiator. The photopolymerization initiator is preferable in that the polymerization reaction can be initiated under lower temperature conditions. Preferable examples of the photopolymerization initiator that can be used in the composition for forming an optically anisotropic film include the same ones as those exemplified above.

Since the composition for forming a horizontally oriented liquid crystal cured film is usually applied to a substrate or the like in a state of being dissolved in a solvent, it is preferable to contain a solvent. The solvent is preferably a solvent capable of dissolving the polymerizable liquid crystal compound to be used, and is preferably a solvent inert to the polymerization reaction of the polymerizable liquid crystal compound. Examples of the solvent that can be used in the composition for forming an optically anisotropic film include the same solvents as those exemplified above.

If necessary, the composition for forming a horizontally oriented liquid crystal cured film may contain a photosensitizer, a leveling agent, and additives exemplified as additives contained in the composition for forming an optically anisotropic film. Examples of the photosensitizer and the leveling agent that can be used in the composition for forming an optically anisotropic film include the same solvents as those exemplified above.

The composition for forming a horizontally oriented liquid crystal cured film can be prepared, for example, by mixing and stirring a polymerizable liquid crystal compound and, if necessary, a polymerization initiator, a solvent, an additive, and the like.

The horizontally oriented liquid crystal cured film can be obtained, for example, by applying a composition for forming a horizontally oriented liquid crystal cured film onto a substrate or an oriented film, drying the coating film, allowing the polymerizable liquid crystal compound in the composition for forming a horizontally oriented liquid crystal cured film to be oriented in the horizontal direction, and then polymerizing the polymerizable liquid crystal compound by light irradiation or the like while maintaining the orientation state. Examples of the method that can be employed for the method for applying the composition for forming a horizontally oriented liquid crystal cured film, the method for curing the polymerizable liquid crystal compound by light irradiation, and the like include the methods exemplified in the method for forming an optically anisotropic film, and appropriate methods, conditions, and the like can be employed depending on the components and the like constituting the horizontally oriented liquid crystal cured film.

Examples of the oriented film that can be used for preparing the optically anisotropic film of the present invention include a photo-oriented film in addition to the oriented film containing the orientation polymer exemplified above. From the viewpoint of the accuracy and quality of the orientation angle, a photo-oriented film is preferable as the oriented film for forming a horizontally oriented liquid crystal cured film.

The photo-oriented film is usually obtained by applying a composition (hereinafter, also referred to as "composition for forming a photo-oriented film") containing a polymer or monomer having a photoreactive group and a solvent to a substrate, removing the solvent, and then irradiating the substrate with polarized light (preferably polarized UV). The photo-oriented film is also advantageous in that the direction of the orientation control force can be optionally controlled by selecting the polarization direction of the polarized light to be irradiated.

The photoreactive group refers to a group that produces liquid crystal orientation performance when irradiated with light. Specific examples thereof include groups involved in a photoreaction that is an origin of liquid crystal orientation performance, such as orienting induction or isomerization reaction, dimerization reaction, photo-crosslinking reaction, or photolysis reaction of molecules generated by light irradiation. Among them, a group involved in the dimerization reaction or the photo-crosslinking reaction is preferable from the viewpoint of excellent orientation property. As the photoreactive group, a group having an unsaturated bond, particularly a double bond is preferable, and a group having at least one selected from the group consisting of a carbon-carbon double bond (C═C bond), a carbon-nitrogen double bond (C═N bond), a nitrogen-nitrogen double bond (N═N bond), and a carbon-oxygen double bond (C═O bond) is particularly preferable.

Examples of the photoreactive group having a C═C bond include a vinyl group, a polyene group, a stilbene group, a stilbazole group, a stilbazolium group, a chalcone group, and a cinnamoyl group.

Examples of the photoreactive group having a C═N bond include groups having a structure such as an aromatic Schiff base and an aromatic hydrazone. Examples of the photoreactive group having an N═N bond include an azobenzene group, an azonaphthalene group, an aromatic heterocyclic azo group, a bisazo group, a formazan group, and a group having an azoxybenzene structure. Examples of the photoreactive group having a C═O bond include a benzophenone group, a coumarin group, an anthraquinone group, and a maleimide group. These groups may have substituents such as an alkyl group, an alkoxy group, an aryl group, an allyloxy group, a cyano group, an alkoxycarbonyl group, a hydroxyl group, a sulfonic acid group, and a halogenated alkyl group.

Among them, a photoreactive group involved in the photodimerization reaction is preferable, and a cinnamoyl group and a chalcone group are preferable from the viewpoint that the polarized light irradiation amount required for photo-orientation is relatively small, and a photo-oriented film excellent in thermal stability and temporal stability is easily obtained. As a polymer having a photoreactive group, a polymer having a cinnamoyl group in which a terminal portion of a side chain of the polymer has a cinnamic acid structure is particularly preferable.

By applying the composition for forming a photo-oriented film onto a substrate, a photo-orientation inducing layer can be formed on the substrate. Examples of the solvent contained in the composition include the same solvents as those exemplified above as the solvent that can be used for the composition for forming an optically anisotropic film, and the solvent can be appropriately selected according to the solubility of the polymer or monomer having a photoreactive group.

The content of the polymer or monomer having a photoreactive group in the composition for forming a photo-oriented film can be appropriately adjusted depending on the kind of the polymer or monomer and the thickness of the intended photo-oriented film, and is preferably at least 0.2% by mass, and more preferably in the range of 0.3 to 10% by mass with respect to the mass of the composition for forming a photo-oriented film. The composition for forming a photo-oriented film may contain a polymer material such as polyvinyl alcohol or polyimide or a photosensitizer as long as the characteristics of the photo-oriented film are not significantly impaired.

Examples of the method for applying the composition for forming a photo-oriented film to a substrate include the same method as the method for applying the orienting polymer composition to a substrate. Examples of the method for removing the solvent from the applied composition for forming a photo-oriented film include a natural drying method, a forced-air drying method, a heat drying method, and a reduced-pressure drying method.

In order to irradiate polarized light, the composition for forming a photo-oriented film applied onto a substrate from which a solvent has been removed may be directly irradiated with polarized UV, or polarized light may be irradiated from the substrate side to transmit and irradiate the polarized light. As the polarized light, substantially parallel light is particularly preferable. The wavelength of polarized light to be irradiated is preferably in a wavelength region in which the photoreactive group of the polymer or monomer having the photoreactive group can absorb light energy. Specifically, ultraviolet ray (UV) in a wavelength range of 250 to 400 nm is particularly preferable. Examples of the light source used for the polarized light irradiation include a xenon lamp, a high pressure mercury lamp, an ultra high pressure mercury lamp, a metal halide lamp, and an ultraviolet light laser such as KrF and ArF, and a high pressure mercury lamp, an ultra high pressure mercury lamp, and a metal halide lamp are more preferable. Among them, a high pressure mercury lamp, an ultra-high pressure mercury lamp, and a metal halide lamp are preferable in terms of high emission intensity of ultraviolet rays having a wavelength of 313 nm. By irradiating light from the light source through an appropriate polarizer, polarized UV can be irradiated. As such a polarizer, a polarizing filter, a polarizing prism such as Glan-Thompson or Glan-Taylor, or a wire grid type polarizer can be used.

The thickness of the photo-oriented film for forming a horizontally oriented liquid crystal cured film is usually in the range of 10 to 10,000 nm and preferably in the range of 10 to 1,000 nm.

In the laminate of the present invention, the thickness of the horizontally oriented retardation film (horizontally oriented liquid crystal cured film) can be appropriately selected according to the applied display device, and is preferably 0.1 to 10 μm, more preferably 0.5 to 5 μm, and still more preferably 1 to 3 μm from the viewpoint of thinning the film.

When the polarizing film and the horizontally oriented retardation film are stacked, it is preferable to laminate the polarizing film and the horizontally oriented retardation film so that the slow axis (optical axis) of the horizontally oriented retardation film and the absorption axis of the polarizing film are substantially 45°. By stacking the retardation film and the polarizing film so that the slow axis (optical axis) of the retardation film and the absorption axis of the polarizing film are substantially 45°, a function as a circularly polarizing plate can be obtained. Substantially 45° is usually in the range of 45±5°.

The laminate of the present invention preferably further includes a vertically oriented retardation film on a side of the horizontally oriented retardation film opposite to the polarizing film.

The vertically oriented retardation film that can constitute the laminate of the present invention means a retardation film oriented in a direction perpendicular to an in-plane direction of the film, and may be, for example, a cured product of a polymerizable liquid crystal composition (hereinafter, also referred to as "composition for forming a vertically oriented liquid crystal cured film") containing a polymerizable liquid crystal compound, which a cured product cured in a state where the polymerizable liquid crystal compound is oriented in a direction perpendicular to a plane of the retardation film (hereinafter, also referred to as "vertically oriented liquid crystal cured film").

In the present specification, the terms "vertically oriented retardation film" and "vertically oriented liquid crystal cured film" are different from the optically anisotropic film of the present invention in that they do not satisfy Formulae (1) to (6) of the present application or Formulae (4) to (9) of the present application unless otherwise specified.

By combining a vertically oriented liquid crystal cured film with a laminate (circularly polarizing plate) including a polarizing film and a horizontally oriented retardation film, the vertically oriented liquid crystal cured film can function as an optical compensation film, and thus an oblique reflection hue during the black display can be improved. Hereinafter, the effect related to the improvement (change) of the "oblique reflection hue during the black display" means an improvement effect (that is, the effect of reducing light leakage when viewed from an oblique direction during the black display) in the oblique reflection hue during the black display when the optically anisotropic film is applied to a display device in combination with a horizontally oriented retardation film.

In the laminate of the present invention, the vertically oriented liquid crystal cured film preferably satisfies the following Formulae (18) and (19).

$$-100 \text{ nm} \leq RthC(550) \leq -20 \text{ nm} \tag{18}$$

$$RthC(450)/RthC(550) > 1.00 \tag{19}$$

In Formulae (18) and (19), $Rth(\lambda)$ represents a retardation value in the thickness direction of the vertically oriented retardation film at a wavelength of $\lambda$ nm. The value of $RthC(550)$ and the value of $RthC(450)/RthC(550)$ represent an orientation state of the polymerizable liquid crystal compound in the vertically oriented liquid crystal cured film, and are an index indicating the degree of the oblique optical compensation effect during the black display.

From the viewpoint of further improving the oblique reflection hue during the black display, the retardation value $RthC(550)$ of the vertically oriented liquid crystal cured film in the film thickness direction is more preferably −90 nm or more, still more preferably −80 nm or more, and more preferably −40 nm or less, still more preferably −50 nm or less.

The retardation value $RthC(\lambda)$ of the vertically oriented liquid crystal cured film in the film thickness direction can be adjusted by the thickness dC of the vertically oriented liquid crystal cured film. The in-plane retardation value is determined by the following formula:

$$RthC(\lambda) = ((nxC(\lambda) + nyC(\lambda))/2 - nzC(\lambda)) \times dC$$

(here, in the formula, $nxC(\lambda)$ represents an in-plane principal refractive index of the vertically oriented liquid crystal cured film at a wavelength of $\lambda$ nm, $nyC(\lambda)$ represents a refractive index in a direction orthogonal to $nxC(\lambda)$ in a plane at a wavelength of $\lambda$ nm, $nzC(\lambda)$ represents a refractive index in a thickness direction of the vertically oriented liquid crystal cured film at a wavelength of $\lambda$ nm, $nxC(\lambda)$ can be a refractive index in an optional direction in a film plane when $nxC(\lambda) = nyC(\lambda)$, and dC represents a film thickness of the vertically oriented liquid crystal cured film)

Therefore, in order to obtain the desired retardation value $RthC(\lambda)$ in the film thickness direction, the three-dimensional refractive index and the film thickness dC may be adjusted. The three-dimensional refractive index depends on the molecular structure and orientation state of the polymerizable liquid crystal compound.

Examples of the laminate of the present invention include a laminate obtained by bonding the optically anisotropic film of the present invention to the horizontally oriented retardation film side of a circularly polarizing plate obtained by bonding the polarizing film and the horizontally oriented retardation film. When the laminate is incorporated into an organic EL display device or the like, the front hue and the oblique hue during the white display can be improved, and the effect of improving the oblique hue during the black display can be exhibited.

Another example of the laminate of the present invention includes a laminate including the optically anisotropic film, the polarizing film, the horizontally oriented retardation film, and the vertically oriented retardation film of the present invention in this order. Such a laminate of the present invention is more excellent in the effect of improving the oblique hue during the black display while having a high front hue improving effect and an oblique hue improving effect during the white display.

Examples of the polymerizable liquid crystal compound that forms the vertically oriented retardation film constituting the laminate of the present invention include the polymerizable liquid crystal compounds (X) and (Y) exemplified above as the polymerizable liquid crystal compounds capable of forming the horizontally oriented retardation film.

The vertically oriented retardation film can be obtained, for example, by applying a composition for forming a vertically oriented liquid crystal cured film containing a polymerizable liquid crystal compound and, if necessary, additives such as a polymerization initiator and a leveling agent, a solvent, and the like onto a substrate with or without an oriented film interposed therebetween, drying the coating film, allowing the polymerizable liquid crystal compound in the composition for forming a vertically orientated liquid crystal cured film to be oriented in the vertical direction, and then polymerizing the polymerizable liquid crystal compound by light irradiation or the like while maintaining the orientation state. Examples of additives such as a polymerization initiator and a leveling agent, and a solvent that can be used include those similar to those exemplified above as those that can be used in preparing the optically anisotropic film of the present invention. Examples of the oriented film that can be used for preparing the optically anisotropic film of the present invention include the oriented film containing a vertical orientation promoting compound and the oriented film containing the orientation polymer as exemplified above. Examples of the method that can be adopted for the method for applying the composition for forming a vertically oriented liquid crystal cured film, the method for curing a polymerizable liquid crystal compound by light irradiation, and the like include the methods exemplified in the method for forming an optically anisotropic film, and appropriate methods, conditions, and the like can be adopted depending on the components and the like constituting the vertically oriented liquid crystal cured film.

In the laminate of the present invention, the thickness of the vertically oriented retardation film (vertically oriented liquid crystal cured film) can be appropriately selected according to the applied display device, and is preferably 0.1 to 10 μm, more preferably 0.5 to 5 μm, and still more preferably 1 to 3 μm from the viewpoint of thinning the film.

In the laminate of the present invention, each of the optically anisotropic film, the polarizing film, the horizontally oriented retardation film, and the vertically oriented retardation film may be bonded with a tackifier layer interposed therebetween. The tackifier for forming the tackifier layer is not particularly limited, and the tackifier known in the related art can be appropriately selected and employed. Further, for example, by forming a vertically oriented retardation film formed of a composition for forming a vertically oriented liquid crystal cured film on a horizontally oriented retardation film with or without an oriented film having a vertical orientation control force interposed therebetween, it is easy to realize the reduction in thickness of the laminate.

The laminate of the present invention may have a configuration provided in a general circularly polarizing plate in the related art, or a polarizing film and a retardation film. Examples of such a configuration include a sticker layer (sheet) for bonding a circularly polarizing plate to a display element such as an organic EL, and a protective film used for the purpose of protecting the surface of a polarizing film or a retardation film from scratches and dirt.

The optically anisotropic film and the laminate of the present invention can be used for various display devices.

The display device is a device having a display element, and includes a light emitting element or a light emitting device as a light emitting source. Examples of the display device include a liquid crystal display device, an organic electroluminescence (EL) display device, an inorganic electroluminescence (EL) display device, a touch panel display device, an electron emission display device (for example, a field emission display device (FED) and a surface field emission display device (SED)), an electronic paper (electronic ink, a display device using an electrophoresis element, a plasma display device, a projection-type display device (for example, a grating light valve (GLV) display device and a display device having a digital micromirror device (DMD)), and a piezoelectric ceramic display. The liquid crystal display device includes any of a transmissive liquid crystal display device, a transflective liquid crystal display device, a reflective liquid crystal display device, a direct-view liquid crystal display device, a projection-type liquid crystal display device, and the like. These display devices may be display devices that display two-dimensional images or stereoscopic display devices that display three-dimensional images. In particular, the laminate of the present invention can be suitably used for an organic electroluminescence (EL) display device and an inorganic electroluminescence (EL) display device, and can also be suitably used for a liquid crystal display device and a touch panel display device. These display devices are excellent in the front hue and the oblique hue during the white display, and are also excellent in the front reflection hue and the oblique reflection hue during the black display, and can exhibit excellent image display characteristics.

EXAMPLES

Hereinafter, the present invention will be more specifically described with reference to examples. In the examples, "%" and "part" mean % by mass and part by mass, respectively, unless otherwise specified.

1. Preparation of Horizontally Oriented Retardation Film
(1) Preparation of Composition for Forming Horizontally Oriented Film 5 parts (weight average molecular weight: 30,000) of a photo-oriented material having the following structure and 95 parts of cyclopentanone (solvent) were mixed as components, and the obtained mixture was stirred at 80° C. for 1 hour to obtain a composition for forming a horizontally oriented film.

[Chem. 17]

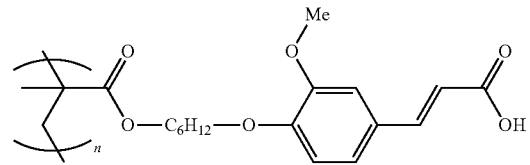

(2) Preparation of Polymerizable Liquid Crystal Compound

A polymerizable liquid crystal compound (X1) and a polymerizable liquid crystal compound (X2) having the following molecular structures were prepared. The polymerizable liquid crystal compound (X1) was produced according to a method disclosed in JP-A-2010-31223. The polymerizable liquid crystal compound (X2) was produced according to a method disclosed in JP-A-2009-173893.

[Chem. 18]

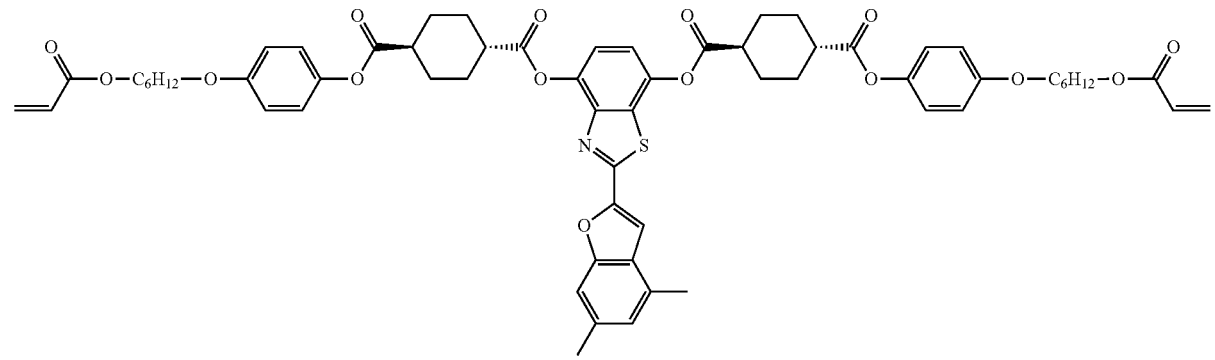

Polymerizable liquid crystal compound (X1)

[Chem. 19]

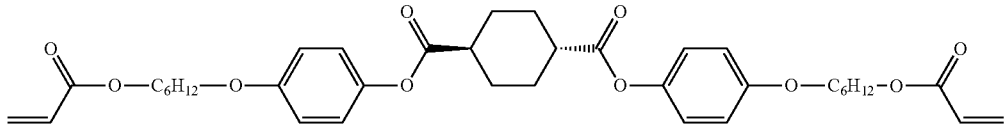

1 mg of the polymerizable liquid crystal compound (X1) was dissolved in 50 mL of tetrahydrofuran to obtain a solution. After the obtained solution was placed as a sample for measurement in a measurement cell having an optical path length of 1 cm, the measurement cell was set in an ultraviolet-visible spectrophotometer ("UV-2450" available from Shimadzu Corporation), and an absorption spectrum was measured. A wavelength at which maximum absorbance was obtained was read from the obtained absorption spectrum. As a result, a maximum absorption wavelength λmax in a wavelength range of 300 to 400 nm was 350 nm.

(3) Preparation of Polymerizable Liquid Crystal Composition for Forming Horizontally Oriented Retardation Film The polymerizable liquid crystal compound (X1) and the polymerizable liquid crystal compound (X2) were mixed at a mass ratio of 90:10 to obtain a mixture. To 100 parts by mass of the obtained mixture, 0.1 parts by mass of a leveling agent "BYK-361N" (available from BM Chemie) and 6 parts by mass of 2-dimethylamino-2-benzyl-1-(4-morpholinophenyl) butane-1-one ("IRGACURE (registered trademark) 369 (Irg 369)" available from BASF Japan Ltd.) as a photopolymerization initiator were added. Further, N-methyl-2-pyrrolidone (NMP) was added so that the solid content concentration was 13%. The mixture was stirred at 80° C. for 1 hour to obtain a polymerizable liquid crystal composition for forming a horizontally oriented retardation film.

(4) Preparation of Horizontally Oriented Retardation Film (Horizontally Oriented Liquid Crystal Cured Film)

After a corona treatment was performed on a COP film (ZF-14-50) available from Zeon Corporation, the composition for forming a horizontally oriented film was applied with a bar coater, and dried at 80° C. for 1 minute, and then by using a polarized UV irradiator (SPOT CURE SP-9; available from Ushio, Inc.), polarized UV exposure was performed at an integrated light intensity of 100 mJ/cm² at a wavelength of 313 nm to obtain a horizontally oriented film.

Subsequently, the polymerizable liquid crystal composition for forming the horizontally oriented retardation film was applied onto the horizontally oriented film using a bar coater, heated at 120° C. for 60 seconds, and then irradiated (integrated light amount at wavelength of 365 nm under nitrogen atmosphere: 500 mJ/cm²) with ultraviolet light from the surface to which the polymerizable liquid crystal composition for forming the horizontally oriented retardation film ii was applied by using a high pressure mercury lamp (UNICURE VB-15201 BY-A, available from Ushio, Inc.), thereby forming the horizontally oriented retardation film (horizontally oriented liquid crystal cured film).

After checking that there was no retardation in the COP film, Re(450) and Re(550) were measured using KOBRA-WPR available from Oji Scientific Instruments, and α=Re(450)/Re(550) was calculated. a of the obtained horizontally oriented retardation film was 0.92.

2. Preparation of Polarizing Film

A 75 μm-thick polyvinyl alcohol film having an average polymerization degree of about 2,400 and a saponification degree of 99.9 mol or more was immersed in pure water at 30° C., and then immersed in an aqueous solution having a mass ratio of iodine/potassium iodide/water of 0.02/2/100 at 30° C. to perform iodine staining (iodine staining step). The polyvinyl alcohol film subjected to the iodine staining step was immersed in an aqueous solution having a mass ratio of potassium iodide/boric acid/water of 12/5/100 at 56.5° C. to perform a boric acid treatment (boric acid treatment step). The polyvinyl alcohol film subjected to the boric acid treatment step was washed with pure water at 8° C. and then dried at 65° C. to obtain a polarizer (thickness after stretching: 27 μm) in which iodine was adsorbed and oriented on polyvinyl alcohol. At this time, stretching was performed in the iodine dyeing step and the boric acid treatment step. The total stretch ratio in such stretching was 5.3 times. The obtained polarizer and a saponified triacetyl cellulose film (KC4UYTAC thickness 40 μm available from Konica Minolta, Inc.) were bonded to each other with a nip roll via an aqueous adhesive. The obtained laminate was dried at 60° C. for 2 minutes while maintaining the tension at 430 N/m to obtain a polarizing film having a triacetyl cellulose film as a protective film on one side.

The aqueous adhesive was prepared by adding 3 parts by mass of carboxyl group-modified polyvinyl alcohol (Kuraray Poval KL318, available from KURARAY CO., LTD) and 1.5 parts by mass of a water-soluble polyamide epoxy resin (Sumirez Resin 650, available from Sumika Chemtex Co., Ltd., aqueous solution having a solid content concentration of 30%) to 100 parts by mass of water.

3. Preparation of Vertically Oriented Retardation Film (1) Preparation of Composition for Forming Vertically Oriented Film 0.5 parts by mass of polyimide ("SUNEVER SE-610" available from Nissan Chemical Industries, Ltd.), 72.3 parts by mass of N-methyl-2-pyrrolidone, 18.1 parts by mass of 2-butoxyethanol, 9.1 parts by mass of ethylcyclohexane, and 0.01 parts by mass of DPHA (available from Shin Nakamura Chemical Co., Ltd.) were mixed to prepare a composition for forming a vertically oriented film.

(2) Preparation of Polymerizable Liquid Crystal Composition for Forming Vertically Oriented Liquid Crystal Cured Film To 100 parts by mass of a liquid crystal compound LC242: Paliocolor LC242 (registered trademark of BASF) represented by the following Formula (LC242), 0.1 parts by mass of a leveling agent ("F-556" available from DIC Corporation) and 3 parts by mass of a polymerization initiator Irg 369 were added, and cyclopentanone was added so that a solid concentration was 13 parts by mass. These were mixed to obtain a polymerizable liquid crystal composition for forming a vertically oriented liquid crystal cured film.

Liquid crystal compound LC242: Paliocolor LC242 (registered trademark of BASF)

[Chem. 20]

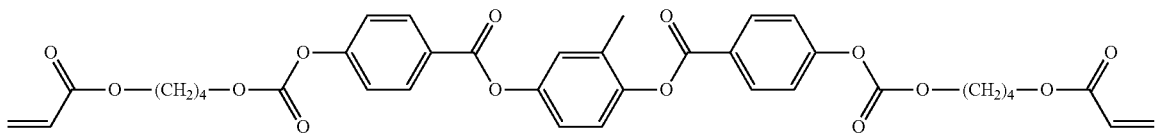

LC242

(3) Preparation of Vertically Oriented Retardation Film (Vertically Oriented Liquid Crystal Cured Film)

A COP film ("ZF-14-23" available from Zeon Corporation) was used as a substrate, and the COP film was subjected to a corona treatment. The composition for forming a vertically oriented film was applied to the COP film subjected to the corona treatment using a bar coater to form a coating film. The coating film was dried at 80° C. for 1 minute to obtain a vertically oriented film. The film thickness of the obtained vertically oriented film was measured with an ellipsometer and found to be 0.2 µm. Subsequently, the polymerizable liquid crystal composition for forming a vertically oriented liquid crystal cured film was applied onto the prepared vertically oriented film to form a coating film. The coating film was dried at 80° C. for 1 minute, and then the dried coating film was irradiated with ultraviolet rays in a nitrogen atmosphere and under the condition of an integrated light amount of 500 mJ/cm$^2$ at a wavelength of 365 nm using a high pressure mercury lamp ("UNICURE VB-15201 BY-A", available from Ushio, Inc.) to form a vertically oriented retardation film (vertically oriented liquid crystal cured film).

4. Components Used in Composition for Forming Optically Anisotropic Film (1) Polymerizable Liquid Crystal Compound The polymerizable liquid crystal compounds represented by the polymerizable liquid crystal compounds (A1) and (A2) were synthesized according to the method described in Lub et al, Recl. Trav. Chim. Pays-Bas, 115, 321-328 (1996).

[Chem. 21]

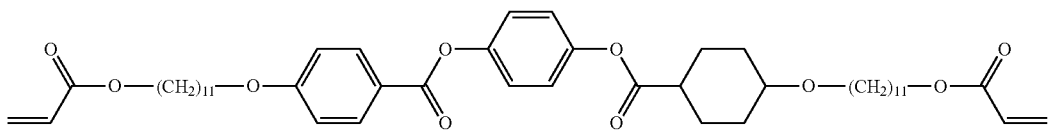

(A1)

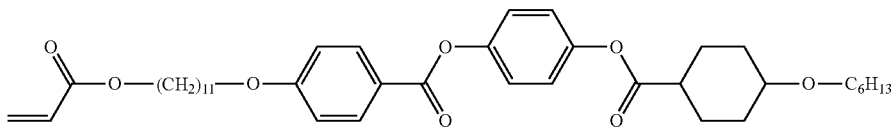

(A2)

(2) Dichroic Dye

Dichroic dye A (Cyan1: cyan dye): Maximum absorption wavelength 592 nm (measured in chloroform solution)

[Chem. 22]

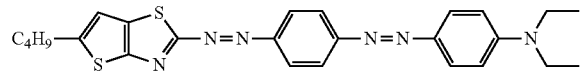

Dichroic dye B (Yellow 1: yellow dye): Maximum absorption wavelength 445 nm (measured in chloroform solution)

[Chem. 23]

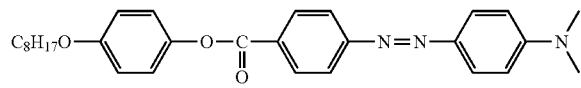

Dichroic dye C (Magenta 1: magenta dye): Maximum absorption wavelength 546 nm (measured in chloroform solution)

[Chem. 24]

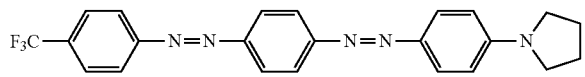

Dichroic dye D (Cyan2: cyan dye): Maximum absorption wavelength 600 nm (measured in chloroform solution)

[Chem. 25]

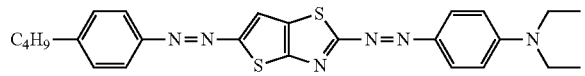

Dichroic dye E (Cyan3: cyan dye): Maximum absorption wavelength 600 nm (measured in chloroform solution)

[Chem. 26]

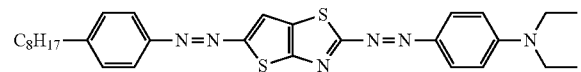

Dichroic dye F (Yellow 2: yellow dye): Maximum absorption wavelength 386 nm (measured in chloroform solution)

[Chem. 27]

Dichroic dye G (Magenta 2: magenta dye): Maximum absorption wavelength 489 nm (measured in chloroform solution)

[Chem. 28]

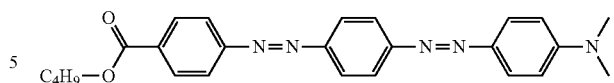

Example 1

(1) Preparation of Optically Anisotropic Film
(i) Preparation of Composition for Forming Optically Anisotropic Film To 100 parts by mass of a mixture of a polymerizable liquid crystal compound (A1) and a polymerizable liquid crystal compound (A2) mixed at a mass ratio of 90:10, 0.25 parts by mass of a leveling agent "F-556" (available from DIC Corporation), 1.2 parts by mass of a dichroic dye A, 1.7 parts by mass of a dichroic dye C, and 6 parts by mass of 2-dimethylamino-2-benzyl-1-(4-morpholinophenyl) butane-1-one ("IRGACURE (registered trademark) 369 (Irg 369)" available from BASF Japan Ltd.) as a photopolymerization initiator were added. Further, o-xylene was added so that the solid concentration was 253. The mixture was stirred at 80° C. for 30 minutes to obtain a composition for forming an optically anisotropic film.

(ii) Preparation of Composition for Forming Vertically Oriented Film

A silane coupling agent "KBE-9103" (available from Shin-Etsu Chemical Co., Ltd.) was dissolved in a mixed solvent obtained by mixing ethanol and water at a ratio of 9:1 (mass ratio) to obtain a composition for forming a vertically oriented film having a solid content of 1%.

(iii) Preparation of Optically Anisotropic Film

After a corona treatment was performed on a COP film (ZF-14-50) available from Zeon Corporation, the composition for forming a vertically oriented film was applied with a bar coater, and dried at 120° C. for 1 minute to obtain a vertically oriented film.

Subsequently, the composition for forming an optically anisotropic film was applied onto the obtained vertically oriented film using a bar coater, dried at 120° C. for 1 minute, and then irradiated (integrated light amount at wavelength of 365 nm under nitrogen atmosphere: 500 mJ/cm$^2$) with ultraviolet light from the surface side on which the composition for forming the optically anisotropic film was applied by using a high pressure mercury lamp (UNICURE VB-15201 BY-A, available from Ushio, Inc.), thereby forming an optically anisotropic film (VMCP). The film thickness of the obtained optically anisotropic film was measured with an interference type film thickness meter and found to be 0.9 μm.

(2) Measurement of Absorbance of Optically Anisotropic Film

The coated surface of the obtained optically anisotropic film was bonded to glass of 4×4 cm×0.7 mm in thickness with a pressure-sensitive adhesive (available from Lintec Corporation) of 25 μm interposed therebetween. This was set in an ultraviolet-visible spectrophotometer ("UV-2450" available from Shimadzu Corporation) to measure the absorbance, and Axλ and Axλ(z=50) were calculated. The results are shown in Table 2.

Note that the x-axis means an optional direction in the plane of the optically anisotropic film, the y-axis means a direction perpendicular to the x-axis in-plane, and the z-axis means a thickness direction of the optically anisotropic film. both Axλ and Axλ(z=50) represent absorbance at a wavelength λ nm (450 nm, 550 nm, 650 nm) of the optically anisotropic film, Ax represents an absorbance of linearly polarized light that oscillates in an x-axis direction, and Ax(z=50) represents an absorbance of linearly polarized light that oscillates in the x-axis direction when the optically anisotropic film is rotated by 50° with a y-axis as a rotation axis.

When the absorbance was measured, the sample was set in an ultraviolet-visible spectrophotometer ("UV-2450" available from Shimadzu Corporation), and corrected so that the absorbance at 800 nm was 0, and then Axλ was measured. Also for Axλ(z=50), the sample was set and inclined in the same manner, then the absorbance at 800 nm was corrected to 0, and then Axλ(z=50) was measured.

(3) Evaluation of Orientation of Optically Anisotropic Film

The coated surface of the obtained optically anisotropic film was bonded to glass of 4×4 cm×0.7 mm in thickness with a pressure-sensitive adhesive (available from Lintec Corporation) of 25 μm interposed therebetween. The bonded optically anisotropic film was observed using a polarizing microscope, and defects due to poor orientation were evaluated according to the following criteria. The results are shown in Table 2.

<Evaluation Criteria>

A: Almost no defect is observed at 200 times magnification.

B: Defects are slightly observed at 200 times magnification.

C: Defects are observed at 200 times magnification.

(4) Preparation of Circularly Polarizing Plate Laminate (i) Preparation of Laminate of Horizontally Oriented Retardation Film and Optically Anisotropic Film The horizontally oriented retardation film and the coated surface (liquid crystal layer side) of the optically anisotropic film obtained by the production method described above were subjected to a corona treatment, and then the coated surface side (liquid crystal layer side) was bonded with a sticker (pressure-sensitive adhesive of 25 μm, available from Lintec Corporation) interposed therebetween to prepare a laminate of the horizontally oriented retardation film and the optically anisotropic film.

(ii) Preparation of Circularly Polarizing Plate Laminate

Subsequently, the surface of the substrate (COP film) on the side of the horizontally oriented retardation film of the obtained laminate was subjected to a corona treatment, and then bonded to the polarizing film with a sticker (pressure-sensitive adhesive of 25 μm, available from Lintec Corporation) interposed therebetween so that the angle formed by the absorption axis of the polarizing film and the slow axis of the horizontally oriented retardation film was 45°, thereby preparing a circularly polarizing plate laminate including the polarizing film, the horizontally oriented retardation film, and the optically anisotropic film in this order.

(5) Evaluation of Optical Characteristics (i) Evaluation of Hue During Black Display <Evaluation Panel>

Oblique yellow panel: FlexPai available from Royole Corporation.

Oblique blue panel: Galaxy S8 available from Samsung Electronics Co., Ltd.

<Checking of Front Reflection Hue and Oblique Reflection Hue>

A front glass and a polarizing plate were removed from "FlexPai" available from Royole Corporation, and the display device was taken out. Thereafter, the circularly polarizing plate laminate prepared by the above-described method was bonded to the display device with a sticker (pressure-sensitive adhesive of 25 μm, available from Lintec Corporation), and the front reflection hue and the oblique reflection hue were checked in a state where the display device was powered off (black display), and evaluated according to the following criteria. The results are shown in Table 3.

The front reflection hue is a hue obtained by visually observing the sample at a distance of 50 cm from the front, and the oblique reflection hue is a hue obtained by visually observing the sample at a distance of 30 cm from the direction of an elevation angle of 50° and an azimuth angle of 0° to 360°.

<Evaluation Criteria>

A: Under the condition that the film and a glossy black drawing paper are arranged 1 m immediately below a 40W3 wavelength lamp, the hue is checked with naked eyes, and almost no hue is felt.

B: When checked with naked eyes alone at 1.5 m immediately below the 40W3 wavelength lamp, slightly tint is felt, and the tint varies depending on the azimuth angle, and it looks slightly bluish black or reddish black.

C: When checked with naked eyes alone at 1.5 m immediately below the 40W3 wavelength lamp, a tint is felt, and the tint varies depending on the azimuth angle, and it looks bluish black or reddish black.

(ii) Evaluation of Hue During White Display

Following the evaluation during the black display, the same sample was used to turn on the display device, to turn off all settings for changing the screen display color such as a blue light cut function and the color balance change after maximizing the luminance, and to check the front hue and the oblique hue during the white display in a state where the white screen was displayed (in a state where the HTML color code #FFFFFF was displayed), and the evaluation was performed according to the following criteria. The results are shown in Table 3.

The front hue is a hue when visually observed and checked at a distance of 30 cm from the front of the sample, and the oblique hue is a hue visually checked from a direction of an elevation angle of 50° and an azimuth angle of 0° to 360° at a distance of 30 cm from the sample.

<Evaluation Criteria>

A: White display is performed in dark room, and hue is checked with naked eye and no tint is felt at all.

B: White display is performed in dark room, and hue is checked with naked eye and almost no tint is felt.

C: White display is performed in dark room, and hue is checked with naked eye and tint is felt.

D: White display is performed in dark room, and hue is checked with naked eye and tint is strongly felt.

Example 2

As the optically anisotropic film, an optically anisotropic film prepared in the same procedure as in Example 1 was used. A coating surface (liquid crystal layer side) of the horizontally oriented retardation film was subjected to a corona treatment, and then bonded to the polarizing film with a sticker (pressure-sensitive adhesive of 25 μm, available from Lintec Corporation) interposed therebetween so that the angle formed by the absorption axis of the polarizing film and the slow axis of the horizontally oriented retardation film was 45°, thereby preparing a laminate. Subsequently, the coating surface (liquid crystal layer side) of the optically anisotropic film was subjected to a corona treatment, and then bonded to the polarizing film side of the laminate with a sticker (pressure-sensitive adhesive of 25

µm, available from Lintec Corporation) interposed therebetween, thereby preparing a circularly polarizing plate laminate including the optically anisotropic film, the polarizing film, and the horizontally oriented retardation film in this order.

The optical characteristics of the circularly polarizing plate laminate were evaluated by the same procedure as in Example 1. The results are shown in Tables 2 and 3.

Example 3

As the optically anisotropic film, an optically anisotropic film prepared in the same procedure as in Example 1 was used. A coating surface (liquid crystal layer side) of the horizontally oriented retardation film was subjected to a corona treatment, and then bonded to the polarizing film with a sticker (pressure-sensitive adhesive of 25 µm, available from Lintec Corporation) interposed therebetween so that the angle formed by the absorption axis of the polarizing film and the slow axis of the horizontally oriented retardation film was 45°, thereby preparing a laminate of the polarizing film and the horizontally oriented retardation film. Subsequently, the substrate side of the horizontally oriented retardation film and the coated surface (liquid crystal layer side) of the vertically oriented retardation film of the obtained laminate were subjected to a corona treatment, and then were bonded to each other with a sticker (pressure-sensitive adhesive of 25 µm, available from Lintec Corporation) interposed therebetween, thereby preparing a new laminate including the polarizing film, the horizontally oriented retardation film, and the vertically oriented retardation film in this order. Subsequently, the coating surface (liquid crystal layer side) of the optically anisotropic film was subjected to a corona treatment, and then bonded to the laminate with a sticker (pressure-sensitive adhesive of 25 µm, available from Lintec Corporation) interposed therebetween, thereby preparing a circularly polarizing plate laminate including the optically anisotropic film, the polarizing film, the horizontally oriented retardation film, and the vertically oriented retardation film in this order.

The optical characteristics of the circularly polarizing plate laminate were evaluated by the same procedure as in Example 1. The results are shown in Tables 2 and 3.

Examples 4 and 5

An optically anisotropic film was prepared by the same procedure as in Example 1 except that the blending amounts of the dichroic dye A and the dichroic dye C were changed to the amounts shown in Table 1. A circularly polarizing plate laminate including the optically anisotropic film, the polarizing film, the horizontally oriented retardation film, and the vertically oriented retardation film in this order was prepared in the same manner as in Example 3 except that the optically anisotropic film thus obtained was used.

The optical characteristics of the circularly polarizing plate laminate were evaluated by the same procedure as in Example 1. The results are shown in Tables 2 and 3.

Examples 6 and 7

An optically anisotropic film was prepared by the same procedure as in Example 1 except that the blending amounts of the dichroic dyes A and C were changed to the amounts shown in Table 1 and the film thickness was changed to the thickness shown in Table 1. A circularly polarizing plate laminate including the optically anisotropic film, the polarizing film, the horizontally oriented retardation film, and the vertically oriented retardation film in this order was prepared in the same manner as in Example 3 except that the optically anisotropic film thus obtained was used.

The optical characteristics of the circularly polarizing plate laminate were evaluated by the same procedure as in Example 1. The results are shown in Tables 2 and 3.

Comparative Example 1

(1) Preparation of Optically Anisotropic Film
(i) Preparation of Composition for Forming Optically Anisotropic Film To 100 parts by mass of a mixture of a polymerizable liquid crystal compound (A1) and a polymerizable liquid crystal compound (A2) mixed at a mass ratio of 90:10, 0.25 parts by mass of a leveling agent "F-556" (available from DIC Corporation), 3.0 parts by mass of a dichroic dye A, and 6 parts by mass of 2-dimethylamino-2-benzyl-1-(4-morpholinophenyl) butane-i-one ("IRGACURE (registered trademark) 369 (Irg 369)" available from BASF Japan Ltd.) as a photopolymerization initiator were added. Further, o-xylene was added so that the solid concentration was 25%. The mixture was stirred at 80° C. for 30 minutes to obtain a composition for forming an optically anisotropic film.
(ii) Preparation of Composition for Forming Vertically Oriented Film A silane coupling agent "KBE-9103" (available from Shin-Etsu Chemical Co., Ltd.) was dissolved in a mixed solvent obtained by mixing ethanol and water at a ratio of 9:1 (mass ratio) to obtain a composition for forming a vertically oriented film having a solid content of 1%.
(iii) Preparation of Optically Anisotropic Film After a corona treatment was performed on a COP film (ZF-14-50) available from Zeon Corporation, the composition for forming a vertically oriented film was applied with a bar coater, and dried at 120° C. for 1 minute to obtain a vertically oriented film.

Subsequently, the composition for forming an optically anisotropic film was applied onto the obtained vertically oriented film using a bar coater, dried at 120° C. for 1 minute, and then irradiated (integrated light amount at wavelength of 365 nm under nitrogen atmosphere: 500 mJ/cm$^2$) with ultraviolet light from the surface side on which the composition for forming the optically anisotropic film was applied by using a high pressure mercury lamp (UNICURE VB-15201 BY-A, available from Ushio, Inc.), thereby forming an optically anisotropic film. The film thickness of the obtained optically anisotropic film was measured with an interference type film thickness meter and found to be 0.6 µm.

The absorbance of the optically anisotropic film was measured in the same procedure as in examples. The results are shown in Table 2.
(2) Preparation of Circularly Polarizing Plate Laminate A circularly polarizing plate laminate including the polarizing film, the horizontally oriented retardation film, and the optically anisotropic film in this order was prepared in the same manner as in Example 1 except that the obtained optically anisotropic film was used as the optically anisotropic film.

The optical characteristics of the circularly polarizing plate laminate were evaluated by the same procedure as in Example 1. The results are shown in Table 3.

Comparative Example 2

A circularly polarizing plate laminate including the optically anisotropic film, the polarizing film, and the horizontally oriented retardation film in this order was prepared in the same manner as in Example 2 except that the optically anisotropic film produced in the same manner as in Comparative Example 1 was used as the optically anisotropic film.

The optical characteristics of the circularly polarizing plate laminate were evaluated by the same procedure as in Example 1. The results are shown in Tables 2 and 3.

Comparative Example 3

A circularly polarizing plate laminate including the optically anisotropic film, the polarizing film, the horizontally oriented retardation film, and the vertically oriented retardation film in this order was prepared in the same manner as in Example 3 except that the optically anisotropic film produced in the same manner as in Comparative Example 1 was used as the optically anisotropic film.

The optical characteristics of the circularly polarizing plate laminate were evaluated by the same procedure as in Example 1. The results are shown in Tables 2 and 3.

Comparative Example 4

An optically anisotropic film was prepared by the same procedure as in Example 1 except that the combination of the dichroic dyes A and C was substituted with the combination of the dichroic dyes A and B, and the blending amount was changed to the amount shown in Table 1. A circularly polarizing plate laminate including the optically anisotropic film, the polarizing film, the horizontally oriented retardation film, and the vertically oriented retardation film in this order was prepared in the same manner as in Example 3 except that the optically anisotropic film obtained was used.

The optical characteristics of the circularly polarizing plate laminate were evaluated by the same procedure as in Example 1. The results are shown in Tables 2 and 3.

Example 8

An optically anisotropic film was prepared by the same procedure as in Example 3 except that a dichroic dye D (Cyan2) was used instead of the dichroic dye A (Cyan1). A circularly polarizing plate laminate including the optically anisotropic film, the polarizing film, the horizontally oriented retardation film, and the vertically oriented retardation film in this order was prepared in the same manner as in Example 3 except that the optically anisotropic film thus obtained was used.

The optical characteristics of the circularly polarizing plate laminate were evaluated by the same procedure as in Example 1. The results are shown in Tables 2 and 3.

Example 9

An optically anisotropic film was prepared by the same procedure as in Example 3 except that a dichroic dye E (Cyan3) was used instead of the dichroic dye A (Cyan1). A circularly polarizing plate laminate including the optically anisotropic film, the polarizing film, the horizontally oriented retardation film, and the vertically oriented retardation film in this order was prepared in the same manner as in Example 3 except that the optically anisotropic film thus obtained was used.

The optical characteristics of the circularly polarizing plate laminate were evaluated by the same procedure as in Example 1. The results are shown in Tables 2 and 3.

Example 10

An optically anisotropic film was prepared by the same procedure as in Example 3 except that a mixture of a dichroic dye D (Cyan2) and a dichroic dye E (Cyan3) with a mass ratio of D:E=1.0:1.4 was used instead of the dichroic dye A (Cyan1). A circularly polarizing plate laminate including the optically anisotropic film, the polarizing film, the horizontally oriented retardation film, and the vertically oriented retardation film in this order was prepared in the same manner as in Example 3 except that the optically anisotropic film thus obtained was used.

The optical characteristics of the circularly polarizing plate laminate were evaluated by the same procedure as in Example 1. The results are shown in Tables 2 and 3.

Example 11

An optically anisotropic film was prepared by the same procedure as in Example 3 except that a dichroic dye G (Magenta2) was used instead of the dichroic dye C (Magenta1). A circularly polarizing plate laminate including the optically anisotropic film, the polarizing film, the horizontally oriented retardation film, and the vertically oriented retardation film in this order was prepared in the same manner as in Example 3 except that the optically anisotropic film thus obtained was used.

The optical characteristics of the circularly polarizing plate laminate were evaluated by the same procedure as in Example 1. The results are shown in Tables 2 and 3.

Example 12

An optically anisotropic film was prepared by the same procedure as in Example 10 except that a dichroic dye G (Magenta2) was used instead of the dichroic dye C (Magenta1). A circularly polarizing plate laminate including the optically anisotropic film, the polarizing film, the horizontally oriented retardation film, and the vertically oriented retardation film in this order was prepared in the same manner as in Example 3 except that the optically anisotropic film thus obtained was used.

The optical characteristics of the circularly polarizing plate laminate were evaluated by the same procedure as in Example 1. The results are shown in Tables 2 and 3.

Example 13

An optically anisotropic film was prepared by the same procedure as in Example 3 except that a dichroic dye B (Yellow1) was used instead of the dichroic dye A (Cyan1) and a dichroic dye G (Magenta2) was used instead of the dichroic dye C (Magenta1). A circularly polarizing plate laminate including the optically anisotropic film, the polarizing film, the horizontally oriented retardation film, and the vertically oriented retardation film in this order was prepared in the same manner as in Example 3 except that the optically anisotropic film thus obtained was used.

The optical characteristics of the circularly polarizing plate laminate were evaluated by the same procedure as in Example 1. Note that, an oblique blue panel: Galaxy S8 available from Samsung Electronics Co., Ltd. was used as an evaluation panel. The hue results are shown in Tables 2 and 3.

Example 14

An optically anisotropic film was prepared by the same procedure as in Example 13 except that a dichroic dye F (Yellow2) was used instead of the dichroic dye B (Yellow1). A circularly polarizing plate laminate including the optically anisotropic film, the polarizing film, the horizontally oriented retardation film, and the vertically oriented retardation film in this order was prepared in the same manner as in Example 3 except that the optically anisotropic film thus obtained was used.

The optical characteristics of the circularly polarizing plate laminate were evaluated by the same procedure as in Example 13. The hue results are shown in Tables 2 and 3.

TABLE 1

| | | | Optically anisotropic film | | | | | |
|---|---|---|---|---|---|---|---|---|
| | | | | Dichroic dye 1 | | | Dichroic dye 2 | |
| | Laminate Configuration | Film thickness T (μm) | Types | Content D1 (parts by mass) | T × D1 | Types | Content D2 (parts by mass) | T × D2 |
| Example 1 | Polarizing film/Horizontally oriented retardation film/Optically anisotropic film | 0.9 | Cyan1 | 1.2 | 1.08 | Magenta1 | 1.7 | 1.53 |
| Example 2 | Optically anisotropic film/Polarizing film/Horizontally oriented retardation film | 0.9 | Cyan1 | 1.2 | 1.08 | Magenta1 | 1.7 | 1.53 |
| Example 3 | Optically anisotropic film/Polarizing film/Horizontally oriented retardation film/Vertically oriented retardation film | 0.9 | Cyan1 | 1.2 | 1.08 | Magenta1 | 1.7 | 1.53 |
| Example 4 | Optically anisotropic film/Polarizing film/Horizontally oriented retardation film/Vertically oriented retardation film | 0.9 | Cyan1 | 0.6 | 0.54 | Magenta1 | 2.3 | 2.07 |
| Example 5 | Optically anisotropic film/Polarizing film/Horizontally oriented retardation film/Vertically oriented retardation film | 0.9 | Cyan1 | 1.7 | 1.53 | Magenta1 | 1.2 | 1.08 |
| Example 6 | Optically anisotropic film/Polarizing film/Horizontally oriented retardation film/Vertically oriented retardation film | 0.5 | Cyan1 | 2.4 | 1.2 | Magenta1 | 3.4 | 1.7 |
| Example 7 | Optically anisotropic film/Polarizing film/Horizontally oriented retardation film/Vertically oriented retardation film | 1.6 | Cyan1 | 0.6 | 0.96 | Magenta1 | 0.9 | 1.44 |
| Comparative Example 1 | Polarizing film/Horizontally oriented retardation film/Optically anisotropic film | 0.6 | Cyan1 | 3.0 | 1.8 | Magenta1 | — | — |
| Comparative Example 2 | Optically anisotropic film/Polarizing film/Horizontally oriented retardation film | 0.6 | Cyan1 | 3.0 | 1.8 | Magenta1 | — | — |
| Comparative Example 3 | Optically anisotropic film/Polarizing film/Horizontally oriented retardation film/Vertically oriented retardation film | 0.6 | Cyan1 | 3.0 | 1.8 | Magenta1 | — | — |
| Comparative Example 4 | Optically anisotropic film/Polarizing film/Horizontally oriented retardation film/Vertically oriented retardation film | 1.1 | Cyan1 | 1.5 | 1.65 | Yellow1 | 1.5 | 1.65 |
| Example 8 | Optically anisotropic film/Polarizing film/Horizontally oriented retardation film/Vertically oriented retardation film | 0.9 | Cyan2 | 1.2 | 1.08 | Magenta1 | 1.7 | 1.53 |
| Example 9 | Optically anisotropic film/Polarizing film/Horizontally oriented retardation film/Vertically oriented retardation film | 0.9 | Cyan3 | 1.2 | 1.08 | Magenta1 | 1.7 | 1.53 |
| Example 10 | Optically anisotropic film/Polarizing film/Horizontally oriented retardation film/Vertically oriented retardation film | 0.9 | Cyan2 + 3 | 1.2 | 1.08 | Magenta1 | 1.7 | 1.53 |
| Example 11 | Optically anisotropic film/Polarizing film/Horizontally oriented retardation film/Vertically oriented retardation film | 0.9 | Cyan1 | 1.2 | 1.08 | Magenta2 | 1.7 | 1.53 |
| Example 12 | Optically anisotropic film/Polarizing film/Horizontally oriented retardation film/Vertically oriented retardation film | 0.9 | Cyan2 + 3 | 1.2 | 1.08 | Magenta2 | 1.7 | 1.53 |

TABLE 1-continued

| | | Optically anisotropic film | | | | | | |
|---|---|---|---|---|---|---|---|---|
| | | Film thickness T (μm) | Dichroic dye 1 | | | Dichroic dye 2 | | |
| | Laminate Configuration | | Types | Content D1 (parts by mass) | T × D1 | Types | Content D2 (parts by mass) | T × D2 |
| Example 13 | Optically anisotropic film/Polarizing film/Horizontally oriented retardation film/Vertically oriented retardation film | 1.2 | Yellow1 | 1.2 | 1.44 | Magenta2 | 1.7 | 2.04 |
| Example 14 | Optically anisotropic film/Polarizing film/Horizontally oriented retardation film/Vertically oriented retardation film | 1.0 | Yellow2 | 1.2 | 1.2 | Magenta2 | 1.7 | 1.7 |

TABLE 2

| | Optically anisotropic film | | | | | | | | |
|---|---|---|---|---|---|---|---|---|---|
| | Optical characteristics | | | | | | | | |
| | Ax450 | Ax450 (z = 50) | Ax550 | Ax550 (z = 50) | Ax650 | Ax650 (z = 50) | Ax450 (z = 50)/Ax550 (z = 50) | Ax650 (z = 50)/Ax550 (z = 50) | Orientation Microscopic observation |
| Example 1 | 0.013 | 0.052 | 0.010 | 0.129 | 0.006 | 0.112 | 0.403 | 0.868 | A |
| Example 2 | 0.013 | 0.052 | 0.010 | 0.129 | 0.006 | 0.112 | 0.403 | 0.868 | A |
| Example 3 | 0.013 | 0.052 | 0.010 | 0.129 | 0.006 | 0.112 | 0.403 | 0.868 | A |
| Example 4 | 0.022 | 0.071 | 0.019 | 0.141 | 0.007 | 0.073 | 0.504 | 0.518 | A |
| Example 5 | 0.013 | 0.045 | 0.015 | 0.116 | 0.011 | 0.144 | 0.388 | 1.241 | A |
| Example 6 | 0.018 | 0.059 | 0.018 | 0.143 | 0.008 | 0.106 | 0.413 | 0.741 | B |
| Example 7 | 0.019 | 0.057 | 0.017 | 0.127 | 0.009 | 0.116 | 0.449 | 0.913 | B |
| Comparative Example 1 | 0.003 | 0.019 | 0.005 | 0.062 | 0.005 | 0.146 | 0.306 | 2.355 | A |
| Comparative Example 2 | 0.003 | 0.019 | 0.005 | 0.062 | 0.005 | 0.146 | 0.306 | 2.355 | A |
| Comparative Example 3 | 0.003 | 0.019 | 0.005 | 0.062 | 0.005 | 0.146 | 0.306 | 2.355 | A |
| Comparative Example 4 | 0.014 | 0.069 | 0.009 | 0.071 | 0.011 | 0.139 | 0.972 | 1.958 | A |
| Example 8 | 0.012 | 0.050 | 0.012 | 0.130 | 0.005 | 0.114 | 0.385 | 0.877 | A |
| Example 9 | 0.014 | 0.049 | 0.011 | 0.127 | 0.006 | 0.110 | 0.386 | 0.866 | A |
| Example 10 | 0.012 | 0.051 | 0.014 | 0.131 | 0.008 | 0.113 | 0.389 | 0.863 | A |
| Example 11 | 0.011 | 0.052 | 0.013 | 0.129 | 0.007 | 0.114 | 0.403 | 0.884 | A |
| Example 12 | 0.013 | 0.051 | 0.010 | 0.131 | 0.007 | 0.112 | 0.389 | 0.855 | A |
| Example 13 | 0.020 | 0.072 | 0.013 | 0.094 | 0.002 | 0.015 | 0.766 | 0.160 | A |
| Example 14 | 0.019 | 0.072 | 0.010 | 0.091 | −0.001 | 0.015 | 0.791 | 0.165 | A |

TABLE 3

| | Laminate | | | | | |
|---|---|---|---|---|---|---|
| | | During white display | | | During black display | | |
| | Evaluation panel | Front hue | Oblique hue | Front/oblique hue | Front hue | Oblique hue | Front/oblique hue |
| Example 1 | ROYOLE (yellow) | A | A | A | A | B | B |
| Example 2 | ROYOLE (yellow) | A | A | A | A | C | C |
| Example 3 | ROYOLE (yellow) | A | A | A | A | A | A |
| Example 4 | ROYOLE (yellow) | A | B | B | A | A | A |
| Example 5 | ROYOLE (yellow) | A | B | B | A | A | A |

TABLE 3-continued

| | | Laminate | | | | | |
| | | During white display | | | During black display | | |
| | Evaluation panel | Front hue | Oblique hue | Front/oblique hue | Front hue | Oblique hue | Front/oblique hue |
|---|---|---|---|---|---|---|---|
| Example 6 | ROYOLE (yellow) | B | A | B | A | A | A |
| Example 7 | ROYOLE (yellow) | B | A | B | A | A | A |
| Comparative Example 1 | ROYOLE (yellow) | A | C | C | A | B | B |
| Comparative Example 2 | ROYOLE (yellow) | A | C | C | A | C | C |
| Comparative Example 3 | ROYOLE (yellow) | A | C | C | A | A | A |
| Comparative Example 4 | ROYOLE (yellow) | A | D | D | A | A | A |
| Example 8 | ROYOLE (yellow) | A | A | A | A | A | A |
| Example 9 | ROYOLE (yellow) | A | A | A | A | A | A |
| Example 10 | ROYOLE (yellow) | A | A | A | A | A | A |
| Example 11 | ROYOLE (yellow) | A | A | A | A | A | A |
| Example 12 | ROYOLE (yellow) | A | A | A | A | A | A |
| Example 13 | Galaxy S8 (blue) | A | A | A | A | A | A |
| Example 14 | Galaxy S8 (blue) | A | A | A | A | A | A |

What is claimed is:

1. An optically anisotropic film which is a cured film of a polymerizable liquid crystal composition containing a polymerizable liquid crystal compound and at least two dichroic dyes, wherein the at least two dichroic dyes contain a combination of at least one cyan dye and at least one magenta dye or a combination of at least one yellow dye and at least one magenta dye, wherein the at least two dichroic dyes are contained in an amount of 0.1 parts by mass or more and 5 parts by mass or less, based on 100 parts by mass of a polymerizable liquid crystal compound, and wherein the optically anisotropic film is a film in which the polymerizable liquid crystal compound and the at least two dichroic dyes are cured in a state of being molecularly oriented in a vertical direction with respect to a film plane, and satisfies Formula (1) to Formula (6) or Formula (4) to Formula (9) below:

$$0.001 \leq Ax450(z=50) \leq 0.100 \quad (1)$$

$$0.070 \leq Ax550(z=50) \leq 1.000 \quad (2)$$

$$0.070 \leq Ax650(z=50) \leq 1.000 \quad (3)$$

$$0.001 \leq Ax450 \leq 0.050 \quad (4)$$

$$0.001 \leq Ax550 \leq 0.050 \quad (5)$$

$$0.001 \leq Ax650 \leq 0.050 \quad (6)$$

$$0.050 \leq Ax450(z=50) \leq 1.000 \quad (7)$$

$$0.070 \leq Ax550(z=50) \leq 1.000 \quad (8)$$

$$0.001 \leq Ax650(z=50) \leq 0.100 \quad (9)$$

and wherein in Formulae (1) to (9), both $Ax\lambda$ and $Ax\lambda(z=50)$ represent absorbance at a wavelength $\lambda$ nm, $Ax$ represents an absorbance of linearly polarized light that oscillates in an x-axis direction, and $Ax$ ($z=50$) represents an absorbance of linearly polarized light that oscillates in the x-axis direction when the optically anisotropic film is rotated by 50° with a y-axis as a rotation axis, the x-axis represents a direction in the plane of the optically anisotropic film, the y-axis represents a direction orthogonal to the x-axis in the plane of the optically anisotropic film, and the z-axis represents a thickness direction of the optically anisotropic film.

2. The optically anisotropic film according to claim 1, which satisfies Formula (10) or Formula (11) below:

$$0.1 \leq Ax450(z=50)/Ax550(z=50) \leq 1.5 \quad (10)$$

$$0.1 \leq Ax650(z=50)/Ax550(z=50) \leq 1.5 \quad (11)$$

wherein in Formulae (10) and (11), $Ax\lambda$ and $Ax\lambda(z=50)$ have a same meaning as described above.

3. The optically anisotropic film according to claim 1, wherein a film thickness is 0.1 μm or more and 5 μm or less.

4. The optically anisotropic film according to claim 3, wherein the at least two dichroic dyes satisfy Formula (12) and Formula (13) below:

$$T \times D1 = 0.4 \text{ to } 1.7 \quad (12)$$

$$T \times D2 = 0.6 \text{ to } 2.7 \quad (13)$$

wherein in Formulae (12) and (13), T represents a film thickness (μm), D1 represents an amount (parts by mass) of a cyan dye or a yellow dye based on 100 parts by mass of the polymerizable liquid crystal compound, and D2 represents an amount (parts by mass) of a magenta dye based on 100 parts by mass of the polymerizable liquid crystal compound.

5. The optically anisotropic film according to claim 1, comprising at least one azo dye as the dichroic dye.

6. The optically anisotropic film according to claim 1, wherein the polymerizable liquid crystal compound is a liquid crystal compound exhibiting a higher order smectic liquid crystal phase.

7. A laminate comprising:
   the optically anisotropic film according to claim 1;
   a polarizing film; and
   a horizontally oriented retardation film.

8. The laminate according to claim 7, comprising in order of:
   the optically anisotropic film;
   the polarizing film; and
   the horizontally oriented retardation film.

9. The laminate according to claim 8, further comprising:
   a vertically oriented retardation film on a side of the horizontally oriented retardation film opposite to the polarizing film.

10. An organic EL display device comprising the laminate according to claim 7.

* * * * *